United States Patent
Hayashi et al.

(10) Patent No.: US 8,164,258 B2
(45) Date of Patent: Apr. 24, 2012

(54) EMISSIVE DEVICE HAVING A LAYER THAT RELIEVES EXTERNAL FORCES ON ADJACENT LAYER, PROCESS FOR PRODUCING THE EMISSIVE DEVICE AND AN ELECTRONIC APPARATUS INCLUDING THE EMISSIVE DEVICE

(75) Inventors: Kenji Hayashi, Suwa (JP); Yukio Yamauchi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 666 days.

(21) Appl. No.: 11/557,386

(22) Filed: Nov. 7, 2006

(65) Prior Publication Data

US 2007/0132381 A1 Jun. 14, 2007

(30) Foreign Application Priority Data

Dec. 8, 2005 (JP) ................................. 2005-354359

(51) Int. Cl.
*H01L 51/52* (2006.01)
(52) U.S. Cl. ...................................................... 313/512
(58) Field of Classification Search .................. None
See application file for complete search history.

(56) References Cited

U.S. PATENT DOCUMENTS

| | | | | |
|---|---|---|---|---|
| 5,684,365 A * | 11/1997 | Tang et al. | ................ | 315/169.3 |
| 6,136,622 A | 10/2000 | Fukuzawa et al. | | |
| 6,872,473 B2 | 3/2005 | Song et al. | | |
| 2004/0066137 A1 * | 4/2004 | Hayashi | ................ | 313/506 |
| 2004/0202893 A1 * | 10/2004 | Abe | ................ | 428/690 |
| 2004/0212759 A1 * | 10/2004 | Hayashi | ................ | 349/84 |
| 2005/0242720 A1 | 11/2005 | Sano et al. | | |

FOREIGN PATENT DOCUMENTS

| | | |
|---|---|---|
| JP | A-07-169567 | 7/1995 |
| JP | A 9-185994 | 7/1997 |
| JP | A 11-162639 | 6/1999 |
| JP | A 2000-223264 | 8/2000 |
| JP | A 2001-284041 | 10/2001 |
| JP | A 2003-17244 | 1/2003 |
| JP | A-2003-133063 | 5/2003 |
| JP | A 2003-142255 | 5/2003 |
| JP | A-2004-228034 | 8/2004 |
| JP | A 2004-310053 | 11/2004 |
| JP | A 2005-85488 | 3/2005 |
| JP | A-2005-317476 | 11/2005 |
| JP | A 2006-147528 | 6/2006 |

* cited by examiner

*Primary Examiner* — Toan Ton
*Assistant Examiner* — Britt D Hanley
(74) *Attorney, Agent, or Firm* — Oliff & Berridge, PLC

(57) ABSTRACT

An emissive device includes a substrate; a plurality of first electrodes; pixel banks having a plurality of openings each corresponding to the position of a corresponding one of the first electrodes; organic function layers disposed in at least the openings; a second electrode disposed so as to cover the pixel banks and the organic function layers; a first inorganic layer disposed over the second electrode; a second inorganic layer disposed over the first inorganic layer; an organic buffer layer disposed over the second inorganic layer; and a gas barrier layer disposed over the organic buffer layer.

24 Claims, 14 Drawing Sheets

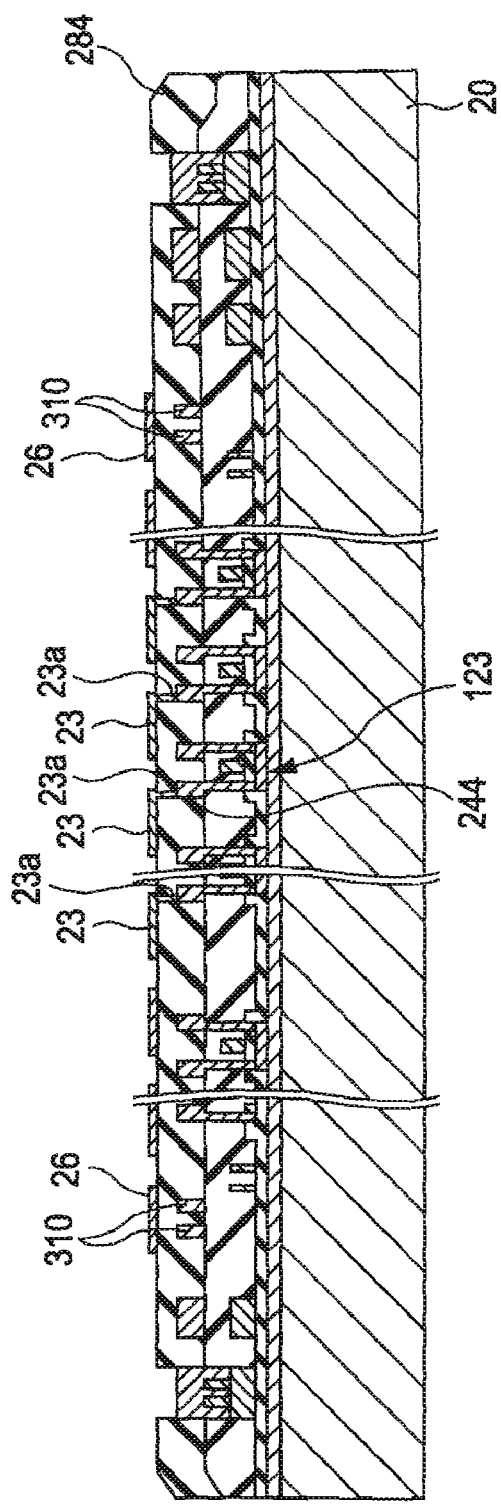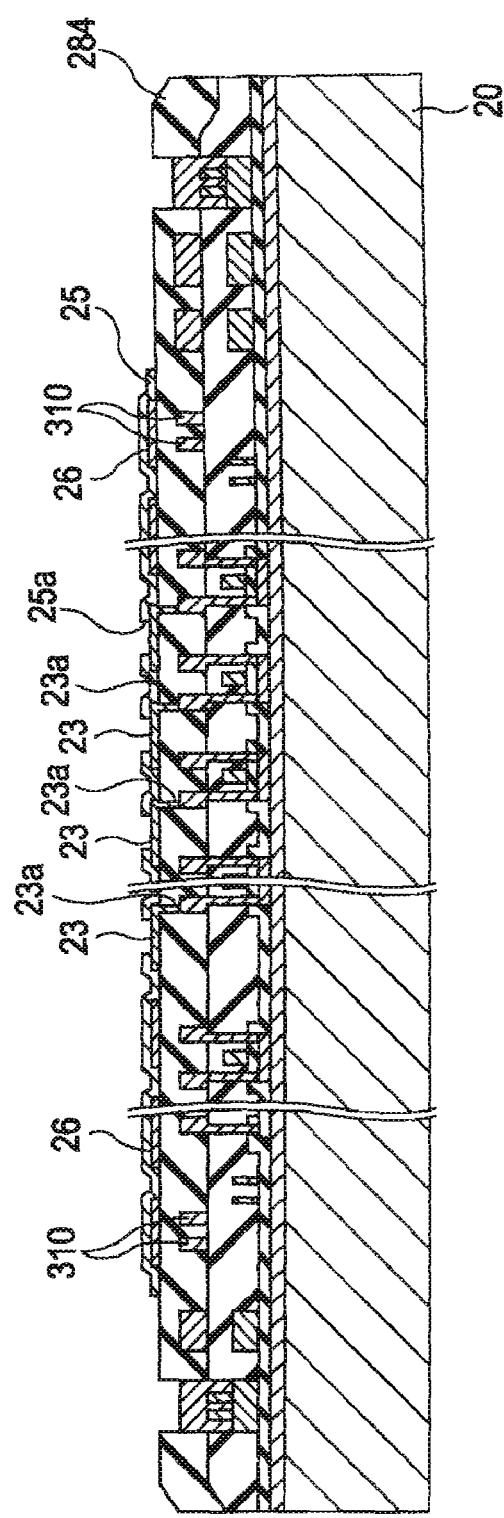

FIG. 8A
FIG. 8B
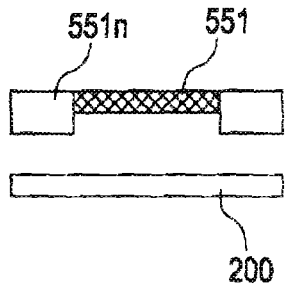
FIG. 8C
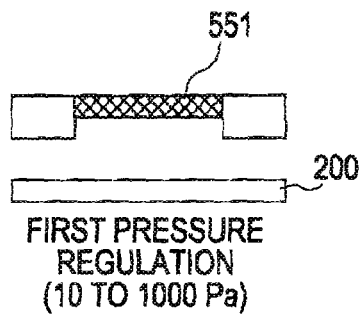
FIRST PRESSURE REGULATION (10 TO 1000 Pa)
FIG. 8D
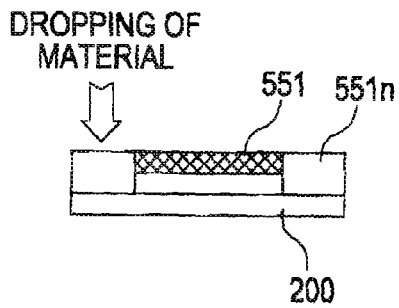
DROPPING OF MATERIAL
FIG. 8E
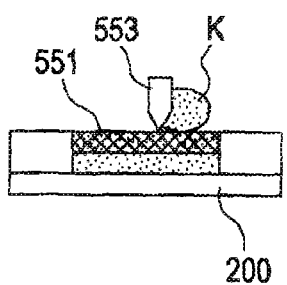
FIG. 8F
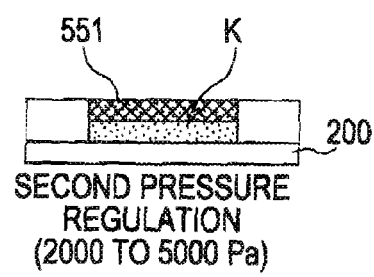
SECOND PRESSURE REGULATION (2000 TO 5000 Pa)
FIG. 8G
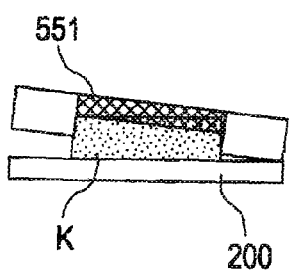
FIG. 8H
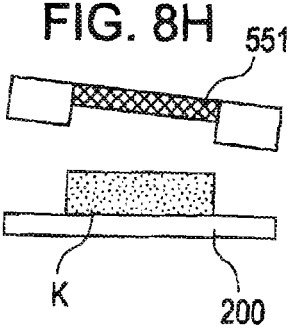
FIG. 8I
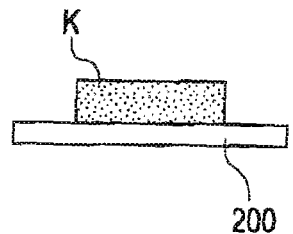
FIG. 8J
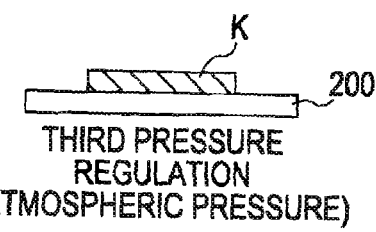
THIRD PRESSURE REGULATION (ATMOSPHERIC PRESSURE)
FIG. 8K
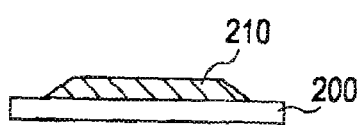

FIG. 11

| | MATERIAL OF FIRST CATHODE-PROTECTING LAYER | ELASTIC MODULUS (GPS) | CRACK DUE TO STRESS ON ORGANIC BANK LAYER (THICKNESS: 100 nm) |
|---|---|---|---|
| EXAMPLE | ALKALI HALIDE (e.g. LiF, MgF$_2$) | 15 TO 68 | NONE (TRANSPARENT) |
| | Mg | 41 | NONE (OPAQUE) |
| | Zn | 43 | NONE (OPAQUE) |
| | Al | 69 | NONE (OPAQUE) |
| | Ag | 76 | NONE (OPAQUE) |
| | SiO$_2$ | 94 | NONE (TRANSPARENT) |
| COMPARATIVE EXAMPLE | Ti | 116 | CRACK OCCURRED |
| | Pt | 172 | CRACK OCCURRED |
| | MgO | 240 TO 275 | CRACK OCCURRED |
| | SiOxNy | 100 TO 250 | CRACK OCCURRED |
| | Si$_3$N$_4$ | 280 TO 310 | CRACK OCCURRED |
| | Al$_2$O$_3$ | 385 TO 392 | CRACK OCCURRED |

EMISSIVE DEVICE HAVING A LAYER THAT RELIEVES EXTERNAL FORCES ON ADJACENT LAYER, PROCESS FOR PRODUCING THE EMISSIVE DEVICE AND AN ELECTRONIC APPARATUS INCLUDING THE EMISSIVE DEVICE

BACKGROUND

1. Technical Field

The present invention relates to an emissive device, a process for producing the emissive device, and an electronic apparatus.

2. Related Art

In recent years, demands for flat displays having lower power consumption and less weight have been increasing with diversification and the like of information equipment. Organic electroluminescent (EL) devices having luminescent layers are one known example of the flat displays. Typically, the organic EL devices each have a structure in which the luminescent layer is disposed between an anode and a cathode. To improve hole-injection properties and electron-injection properties, a structure in which a hole-injection layer is disposed between the anode and the luminescent layer and a structure in which an electron-injection layer is disposed between the luminescent layer and the cathode have been developed.

Many materials used for luminescent layers, hole-injection layers, and electron-injection layers of organic EL devices easily react with moisture in the atmosphere and degraded. Degradation of these layers causes the formation of a nonluminous region, which is referred to as "dark spot", in an organic EL device, thus reducing the lifetime of the luminescent device. Accordingly, an important issue in designing of such organic EL devices is to suppress effects of moisture, oxygen, and the like.

To overcome the problems, a method for preventing water and oxygen to permeate by bonding a seal composed of glass or a metal on the substrate of an organic EL device has been commonly employed. However, trends toward larger screens and reductions in thickness and weight of organic EL devices make it difficult to prevent the permeation of water and oxygen with the bonded seal alone. Furthermore, to sufficiently ensure an area for forming driving elements and leads as screens is increased in size, it is necessary to use a top emission structure in which light emerges from a seal side. To achieve such requirements, a seal structure using a thin film that is transparent, lightweight, and strong is required.

To cope with the increase in the size of the screen and the reductions in thickness and weight of the display, for example, JP-A-9-185994, JP-A-2001-284041, JP-A-2000-223264, and JP-A-2003-17244 each have recently disclosed a thin-film sealing technique in which a transparent thin film composed of a silicon nitride, a silicon oxide, a ceramic material, or the like, the film having satisfactory gas barrier properties, is formed as a gas barrier layer on luminescent elements bay a high-density plasma film-forming method, such as ion plating, electron-cyclotron-resonance (ECR) plasma sputtering, ECR plasma chemical vapor deposition (CVD), surface wave plasma CVD, or ICP-CVD. It is possible to prevent the penetration of water into the luminescent elements by the technique.

However, even when the technique is employed, the penetration of water from the exterior cannot be completely prevented, not resulting in sufficient emission properties or emission lifetime. In particular, the occurrence of the detachment of or a crack in a gas barrier layer at the periphery or bumps due to pixel banks and the like causes the penetration of water therefrom. Thus, an attempt is made to prevent a crack in the gas barrier layer by disposing an organic buffer layer having a substantially flat top face at the lower side of the gas barrier layer.

However, the organic buffer layer is formed under reduced-pressure atmosphere. In particular, since a cathode is formed of a thin film in a top emission structure in order to be transparent, a load on the cathode layer causes detachment or a crack at the periphery or bumps. Thus, target emission properties cannot be disadvantageously provided.

SUMMARY

Advantages of an emissive device, a process for producing the emissive device, and an electronic apparatus according to some aspects of the invention is described below.

According to a first aspect of the invention, a emissive device includes a substrate; a plurality of first electrodes; pixel banks having a plurality of openings each corresponding to the position of a corresponding one of the first electrodes; organic function layers disposed in at least the openings; a second electrode disposed so as to cover the pixel banks and the organic function layers; a first inorganic layer disposed over the second electrode; a second inorganic layer disposed over the first inorganic layer; an organic buffer layer disposed over the second inorganic layer; and a gas barrier layer disposed over the organic buffer layer.

According to the first aspect of the invention, external forces working on the second electrode and the second inorganic layer are relieved to prevent the occurrence of, for example, the detachment of and a crack in the second electrode and the second inorganic layer during a process for producing the organic buffer layer and the like. For example, a load applied by contact with a mesh screen is relieved, thus preventing the occurrence of a defect, such as the detachment of or a crack in the second electrode and the second inorganic layer.

The second electrode is composed of a light-transmitting thin metal film and/or a light-transmitting conductive metal oxide film. The first inorganic layer and the second inorganic layer are each composed of an insulating inorganic compound.

The first inorganic layer is composed of a material having a lower elastic modulus than the second inorganic layer. Thus, the first inorganic layer can relieve external forces working on the second inorganic layer.

The first inorganic layer is composed of a material having a higher elastic modulus than the organic buffer layer. Thus, the second electrode can be protected by the first inorganic layer together with the second inorganic layer.

The first inorganic layer is composed oaf a material having an elastic modulus of 10 to 100 GPa. Thus, the occurrence of the detachment of and cracks in the second electrode and the second inorganic layer can be surely prevented.

The thickness of the first inorganic layer is larger than the thickness of the second inorganic layer and smaller than the thickness of the organic buffer layer. This structure can function to relieve only external forces working on the second inorganic layer.

The first inorganic layer completely covers the organic function layers, the pixel banks, and the second electrode and is entirely covered by the gas barrier layer.

The first inorganic layer is composed of an inorganic oxide or an alkali halide. Thus, the first inorganic layer has low elastic modulus and high transparency. Furthermore, the first inorganic layer having an increased thickness can be formed at a low temperature in a short time at low cost. Therefore, the occurrence of the detachment of and cracks in the second electrode and the second inorganic layer can be surely prevented.

The second inorganic layer has substantially the same elastic modulus as the gas barrier layer. Thus, the penetration of water and the like can be prevented by the second inorganic layer together with the gas barrier layer.

The organic buffer layer is composed of an epoxy resin. Thus, the occurrence of a crack and the like in the gas barrier layer can be prevented.

The angle defined by a surface of the organic buffer layer at each end of the organic buffer layer and a surface of the second inorganic layer is 20° or less. Thus, the detachment of the organic buffer layer at the ends thereof can be prevented.

According to a second aspect of the invention, a process for producing an emissive device includes forming a plurality of first electrodes on a substrate; forming pixel banks having a plurality of openings each corresponding to the position of a corresponding one of the first electrodes; forming organic function layers in at least the openings; forming a second electrode in such a manner that the second electrode covers the pixel banks and the organic function layers; forming a first inorganic layer over the second electrode; forming a second inorganic layer over the first inorganic layer; forming an organic buffer layer over the second inorganic layer; and forming a gas barrier layer over the organic buffer layer.

According to the second aspect of the invention, the first inorganic layer relieves external forces working on the second electrode and the second inorganic layer during the step of forming the organic buffer layer, thus preventing the occurrence of a defect, such as the detachment of or a crack in the second electrode and the second inorganic layer. For example, a load applied by contact with a mesh screen is relieved, thus preventing the occurrence of a defect, such as the detachment of or a crack in the second electrode and the second inorganic layer.

The first inorganic layer is composed of a material having a lower elastic modulus than the second inorganic layer. Thus, the first inorganic layer can relieve the external forces on the second inorganic layer.

The first inorganic layer is composed of a material having a higher elastic modulus than the organic buffer layer. Thus, the second electrode can be protected by the first inorganic layer together with the second inorganic layer.

The first inorganic layer is composed of a material having an elastic modulus of 10 to 100 GPa. Thus, the occurrence of a crack in or detachment of the second electrode and the second inorganic layer can be surely prevented.

The first inorganic layer and the second inorganic layer are successively formed in the same film-forming apparatus, thus improving production efficiency and reducing production costs.

The organic buffer layer is formed by screen printing under a reduced-pressure atmosphere, thus removing water from the organic buffer layer and preventing the inclusion of a bubble.

According to a third aspect of the invention, an electronic apparatus includes the emissive device according to the first aspect of the invention. According to the third aspect of the invention, an electronic apparatus provided with a display having high-quality image properties is produced.

BRIEF DESCRIPTION OF THE DRAWINGS

The invention will be described with reference to the accompanying drawings, wherein like numbers reference like elements.

FIGS. 6A to 6D show steps in a production process of the EL display.

FIGS. 8A to 8K show steps of screen printing.

FIG. 11 is a table showing the presence or absence of the occurrence of a defect when a first cathode-protecting layer is disposed on a cathode.

DESCRIPTION OF EXEMPLARY EMBODIMENTS

An emissive device, a process for producing the emissive device, and an electronic apparatus according to embodiments of the invention will be described with reference to the drawings. An electroluminesent display including an organic electroluminescent material, which is an example of organic functional materials, will be described as the emissive device.

First Embodiment

Figure 1:
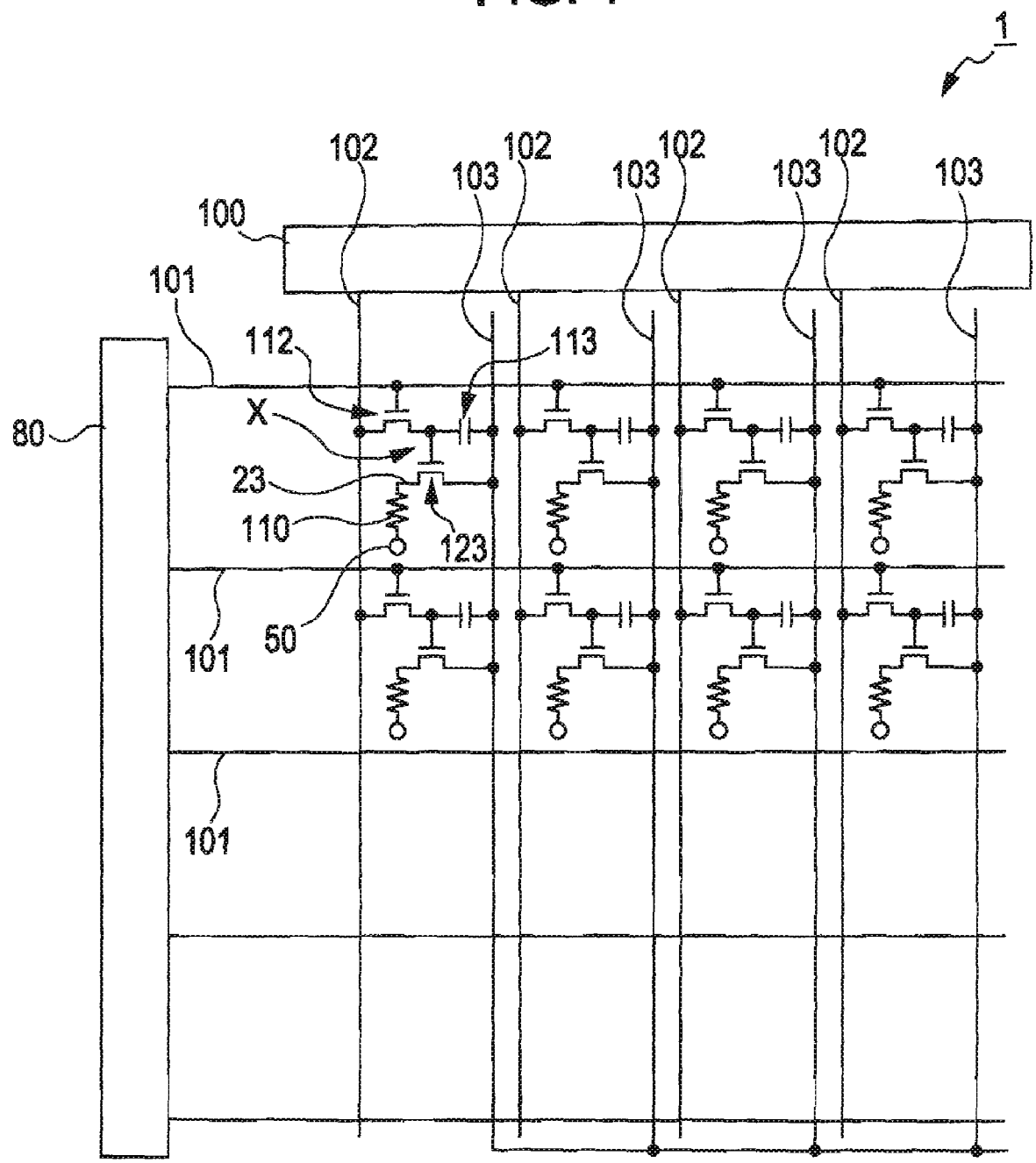
FIG. 1 shows the wiring structure of an EL display according to a first embodiment of the invention.

FIG. 1 shows the wiring structure of an EL display 1 according to a first embodiment of the invention.

The EL display 1 (emissive device) is of an active matrix type including thin-film transistors (hereinafter, referred to as "TFTs") as switching elements.

Hereinafter, portions and layers constituting the EL display 1 are shown at different scales so as to be recognizable in the drawings.

The EL display 1 includes a plurality of scan lines 101; a plurality of signal lines 102 extending perpendicularly to the scan lines 101; a plurality of power lines 103 extending in parallel with the signal lines 102; and pixel regions X disposed in the vicinity of intersections of each scan line 101 and the corresponding signal line 102.

The signal lines 102 are connected to a data-line-driving circuit 100 including a shift resister, a level shifter, a video line, and an analog switch. The scan lines 101 are connected to a scan-line-driving circuit 80 having a shift register and a level shifter.

Each pixel region X includes a switching TFT 112 having a gate electrode to which a scan signal is fed through the corresponding scan line 101; a storage capacitor 113 retaining an image signal from the corresponding signal line 102 via the switching TFT 112; a driving TFT 123 having a gate electrode to which the image signal retained in the storage capacitor 113 is fed; a pixel electrode 23 (first electrode) into which a driving current flows from the corresponding power line 103 when the pixel electrode 23 is coupled to the corresponding power line 103 via the driving TFT 123; and an organic functional layer 110 disposed between the pixel electrode 23 and a cathode 50 (second electrode). The pixel electrode 23, the cathode 50, and the organic functional layers 110 constitute an emissive device (organic EL device).

According to the EL display 1, driving a scan line 101 allows the corresponding switching TFT 112 to be in an ON state. Then, the potential of the signal line 102 at this point is stored in the corresponding storage capacitor 113. An ON or OFF state of the driving TFT 123 is determined on the basis of the state of the storage capacitor 113. Then, a current flows from the power line 103 to the corresponding pixel electrode 23 via the channel of the corresponding driving TFT 123 and then flows into the cathode 50 through the corresponding organic functional layer 110. The organic functional layer 110 emits light in accordance with current flowing therethrough.

The specific structure of the EL display 1 will be described with reference to FIGS. 2 to 5.

Figure 2:
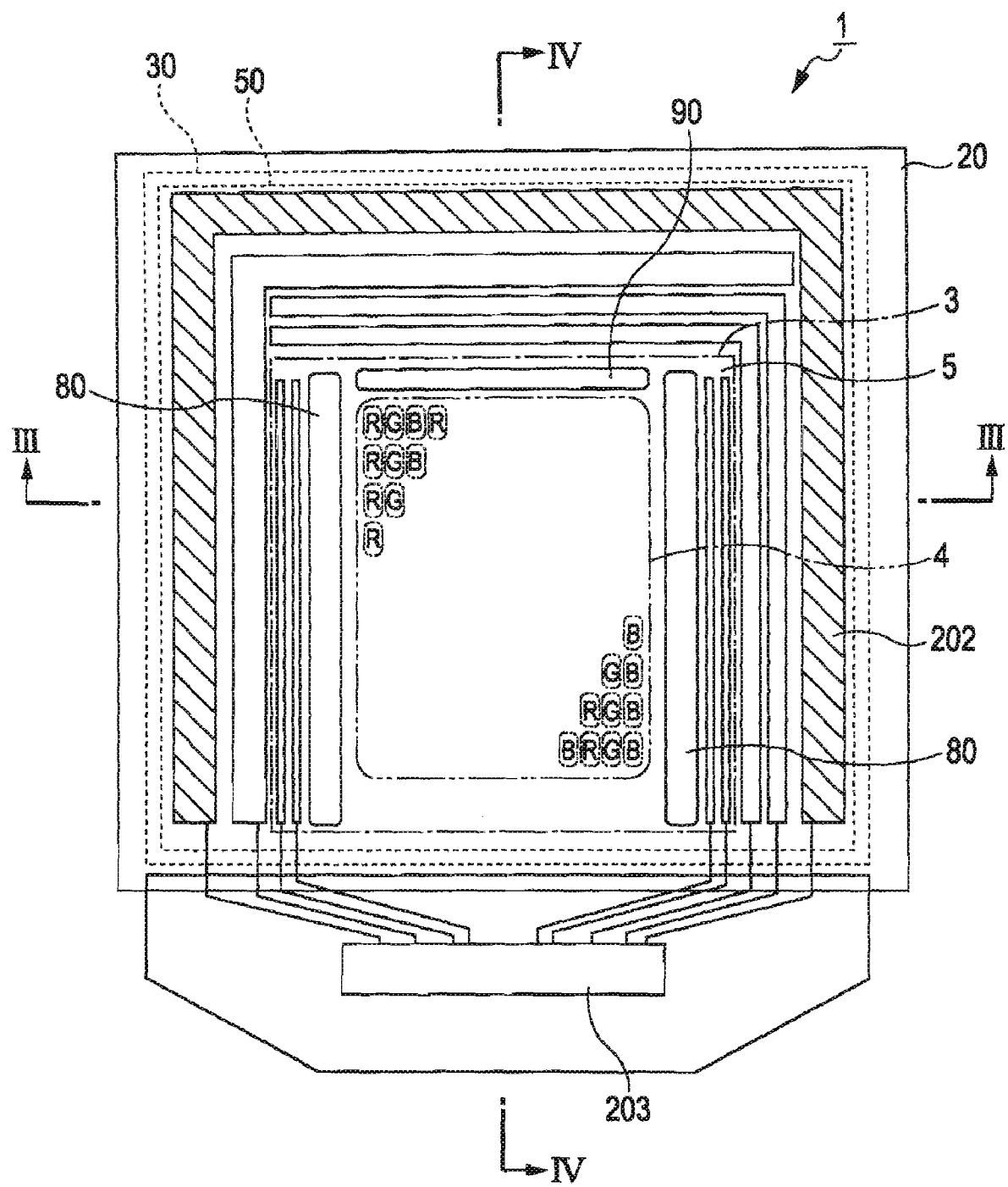
FIG. 2 is a schematic diagram showing the structure of the EL display.

As shown in FIG. 2, the EL display 1 is of an active matrix type and includes an insulating substrate 20; a pixel electrode region (not shown) in which pixel electrodes connected to the switching TFTs (not shown) are arrayed in a matrix on the substrate 20; power lines (not shown) disposed around the pixel electrode region and connected to the respective pixel electrodes; and a pixel area 3 (within alternate long and short dashed line in FIG. 2) which is substantially rectangular when viewed from above and which is located on at least the pixel electrode region.

In the invention, the substrate 20, the switching TFTs, a variety of circuits, interlayer insulating film, and the like described below are included in a base 200 (see FIGS. 3 and 4).

The pixel area 3 is partitioned into an actual display area 4 (within alternate long and two short dashes line in FIG. 2) in the middle of the pixel area 3 and a dreamy area 5 (between the alternate long and short dashed line and the chain double-dashed line) disposed around the actual display area 4.

The actual display area 4 includes display areas R, G, and B each having the pixel electrode. The display areas R, G, and B are arrayed in a matrix and are remote from each other in the III-III and IV-IV directions.

The scan-line-driving circuits 80 are disposed at both right and left sides of the actual display area 4 in FIG. 2. The scan-line-driving circuits 80 are disposed under the dummy area 5.

Furthermore, a checking circuit 90 is disposed at the upper side of the actual display area 4 in FIG. 2. The checking circuit 90 for checking the operating state of the organic EL device 1 has, for example, a unit (not shown) for outputting the inspection result to the exterior and inspects the defect or quality of the display at the time of shipping or during manufacturing. The checking circuit 90 is also disposed under the dummy area 5.

Figure 3:
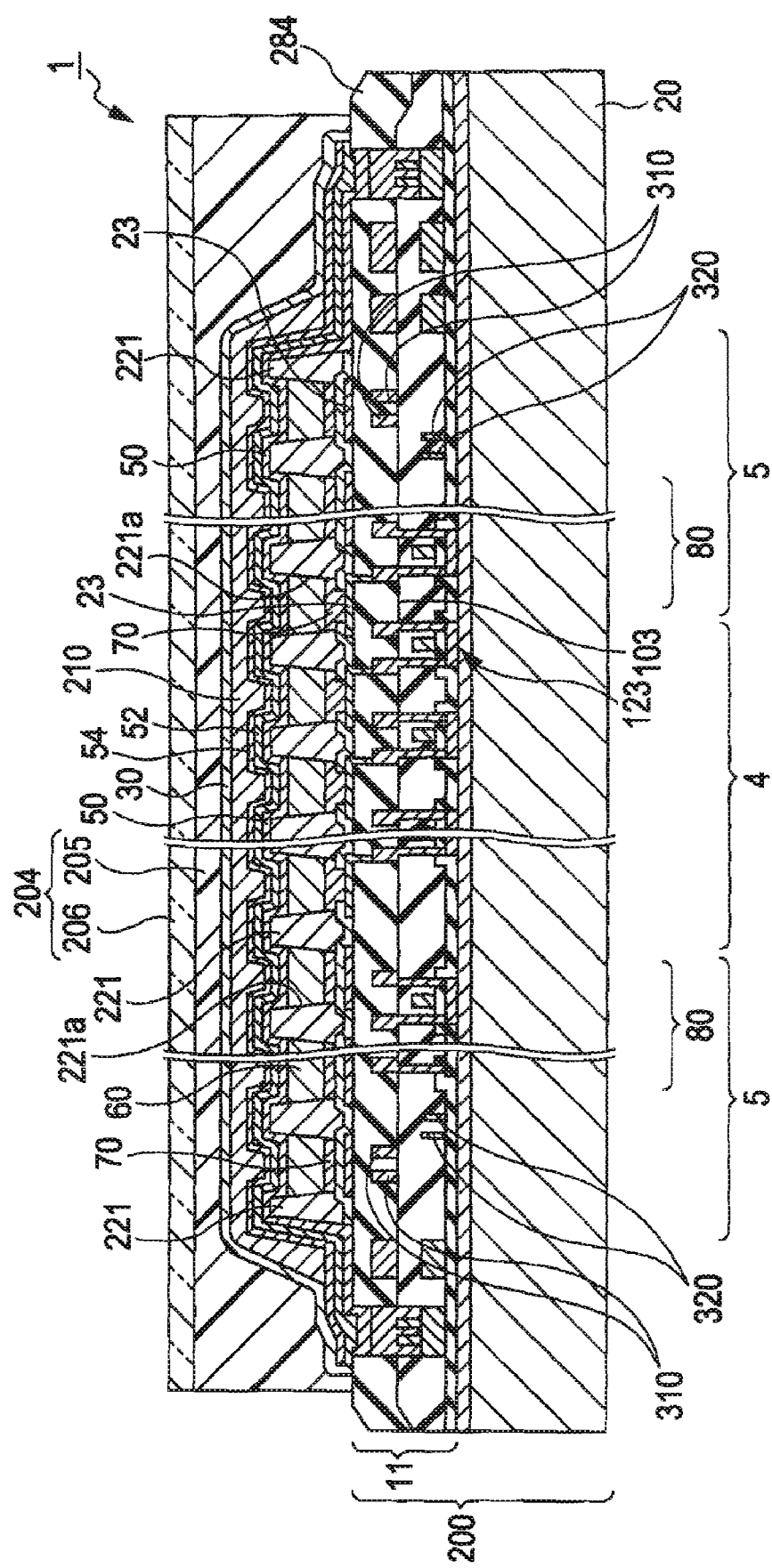
FIG. 3 is a cross-sectional view taken along line III-III in FIG. 2.
Figure 4:
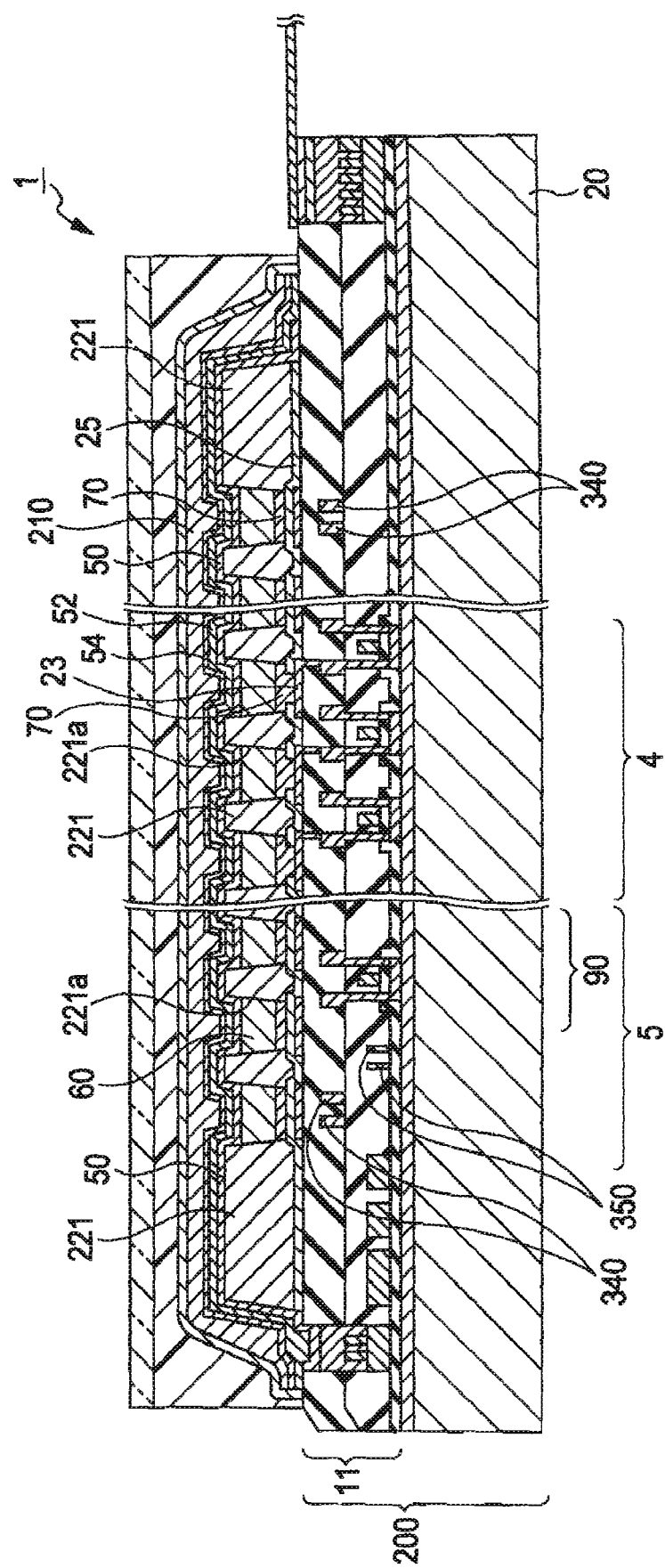
FIG. 4 is a cross-sectional view taken along line IV-IV in FIG. 2.

Driving voltages are applied from a predetermined power supply unit to the scan-line-driving circuits 80 and the checking circuit 90 through driving-voltage conductive lines 310 (see FIG. 3) and driving-voltage conductive lines 340 (see FIG. 4). Driving-control signals and the driving voltages for the scanning-lines-driving circuits 80 and the checking circuit 90 are applied from, for examples a predetermined main driver for controlling the operation of the organic EL device 1 through driving-control-signal conduction lines 320 (see FIG. 3) and driving-voltage conductive lines 350 (see FIG. 4). The driving-control signals are defined as command signals from, for example, the main driver, the command signals controlling output signals from the scan-line-driving circuits 80 and the checking circuit 90.

As shown in FIGS. 3 and 4, the EL display 1 includes many luminescent elements (organic EL elements) on the base 200, the luminescent elements each having a pixel electrode 23, an organic bank (pixel bank) 221, an luminescent layer (organic functional layer) 60, and the cathode 50. The EL display 1 further includes a first cathode-protecting layer (first inorganic layer) 52, a second cathode-protecting layer (second inorganic layer) 54, an organic buffer layer 210, a gas barrier layer 30, and the like, which covers the luminescent elements.

Examples of the luminescent layer 60 include emissive layers (electroluminescent layers). The emissive layer may have carrier injection layer, such as a hole injection layer or an electron injection layer, or a carrier transport layer, such as a hole transport layer or an electron transport layer; a hole-blocking layer; and an electron-blocking layer.

In a top emission EL display, light emerges from the side of the gas barrier layer 30 opposite the substrate 20; hence, a transparent substrate and an opaque substrate may be used as the substrate 20 constituting the base 200. Examples of the opaque substrate include a substrate composed of a ceramic material such as alumina; a metal sheet composed of stainless steel or the like, the sheet being subjected to insulating treatment such as surface oxidation; a substrate composed of a thermosetting resin or a thermoplastic resin; and a film (plastic film) composed of the thermosetting resin or the thermoplastic resin.

In a bottom emission EL display, light emerges from the side of the substrate 20; hence, a transparent or translucent substrate may be used as the substrate 20. Examples of the substrate 20 include substrates composed of glass, quartz, resins (plastics) and plastic films. In particular, a glass substrate is suitably used. In this embodiment, a top emission EL display in which light emerges from the side of the gas barrier layer 30 is used. Thus, the above-described opaque substrate, such as an opaque plastic film, is used as the substrate 20.

A circuit portion 11 including the driving TFTs 123 for driving the pixel electrodes 23 is disposed on the substrate 20. Many luminescent elements (organic EL elements) are disposed on the circuit portion 11. The luminescent elements each include the pixel electrode 23 functioning as an anode; a hole transport layer 70 that injects or transport holes from the pixel electrode 23; luminescent layer 60 having an organic EL material; and the cathode 50.

In this structure, the luminescent element emits light by recombination of a hole injected from the hole transport layer 70 and an electron from the cathode 50 in the luminescent layer 60.

The pixel electrode 23 is not necessarily transparent because the top emission EL display is used in this embodiment. To enhance reflectivity, the pixel electrode 23 may have a multilayer structure constituted by, for example, reflective layer/inorganic insulating layer/transparent ITO anode. The reflective layer reflects light emitted from the luminescent layer to the cathode side and is composed of an aluminum alloy or the like. The inorganic insulating layer is composed of a silicon nitride or the like. The anode is composed of a conductive metal oxide film such as indium tin oxide (ITO) having high hole injection properties and having a work function of 5 eV or more.

Examples of the material of the hole transport layer 70 include polythiophene derivatives, polypyrrole derivatives, doped polythiophene derivatives, and doped polypyrrole derivatives. Specifically, a 3,4-poly(ethylenedioxythiophene)/poly(styrene sulfonate) (PEDOT/PSS) dispersion, i.e., a 3,4-poly(ethylenedioxythiophene) is dispersed in a poly(styrene sulfonate) as a dispersion medium, and then the resulting mixture is dispersed in water to form a dispersion. The hole transport layer 70 can be formed with the resulting dispersion.

The luminescent layer 60 may be composed of a known organic electroluminescent material that can fluoresce or phosphoresce. Examples of the material suitable for the luminescent layer 60 include (poly)fluorene derivatives (PFs), (poly)paraphenylene vinylene derivatives (PPV), polyphenylene derivatives (PP), polyparaphenylene derivatives (PPP), polyvinyl carbazole (PVK), polythiophene derivatives, and polysilanes such as poly(methylphenylsilane) (PMPS).

These polymeric materials may be doped with a polymeric pigment, such as a perylene pigment, a coumalin pigment, or a rhodamine pigment; or a low molecular weight material; such as rubrene, perylene, 9,10-diphenylanthracene, tetraphenylbutadiene, Nile red, coumalin 6, or quinacridone.

Any known low molecular weight material may be used in place of the above-described polymeric material.

According to need, an electron injection layer may be disposed on the luminescent layer 60.

In this embodiment, the hole transport layer 70 and the luminescent layer 60 are surrounded by lyophilic control layer 25 (not shown) and the organic banks (pixel banks) 221 on the base 200 as shown in FIGS. 3 and 4, the lyophilic control layer 25 and the organic banks 221 each being disposed in the form of grid. Thus, the hole transport layer 70 and the luminescent layer 60 function as an elemental layer group constituting a single luminescent element (organic EL element).

The angle defined by the surface of the wall of each opening 221a of the organic banks 221 and the surface of the base 200 is in the range of 110° to 170°. This is because the material for forming the luminescent layer of 60 is easily disposed in the openings 221a when the luminescent layer 60 is formed by a wet process.

As shown in FIGS. 2 to 4, the cathode 50 has a larger area than the total area of the actual display area 4 and the dummy area 5 and covers the actual display area 4 and the dummy area 5. Furthermore, the cathode 50 is formed on the base 200 so as to cover top surfaces of the luminescent layers 60, top surfaces of the organic banks 221, and outer surfaces of the outermost organic bank 221. As shown in FIG. 4, the cathode 50 is connected to a cathode lead 202 at the outer side of the organic bank 221, the cathode lead 202 being disposed at the peripheral portion of the base 200. The cathode lead 202 is connected to a flexible substrate 203. That is, the cathode 50 is connected to a driving IC (driving circuit, not shown) on the flexible substrate 203 via the cathode lead 202.

The material for forming the cathode 50 needs to be optically transparent because of a top emission EL display in this embodiment. Thus, a transparent conductive material is used. A suitable example of the transparent conductive material is ITO. Alternatively, for example, indium oxide-zinc oxide (IZO, registered trademark) amorphous transparent conductive film may be used. In this embodiment, ITO is used.

The cathode 50 is preferably composed of a material having a high effect of injecting electrons (a work function of 4 eV or less). Examples of the material of the cathode 50 include calcium, magnesium, sodium, lithium, and compounds of these metals. Examples of the metal compounds include metal fluorides such as calcium fluoride; metal oxides such as lithium oxide; and organic metal complexes such as calcium acetylacetonate. If the cathode 50 is simply composed of one of the materials, the cathode 50 has high electrical resistance; hence, the cathode 50 does not function as an electrode. Accordingly, a metal layer pattern composed of aluminum, gold, silver, copper, or the like may be disposed at a region other than the luminescent areas. Alternatively, the cathode 50 may be combined with a laminate containing a transparent conductive metal oxide layer composed of ITO, tin oxide, or the like. In this embodiment, a laminate containing a lithium fluoride layer, a magnesium-silver alloy layer, and an ITO layer is used, the thickness of the laminate being adjusted in such a manner that the laminate is transparent.

As shown in FIGS. 3 and 4, the first cathode-protecting layer 52 is disposed on the cathode 50 and covers the organic banks 221 and the cathode 50. The first cathode-protecting layer 52 is disposed in order to relieve a load working on the second cathode-protecting layer 54 during the formation of the organic buffer layer 210 on the second cathode-protecting layer 54.

The first cathode-protecting layer 52 is composed of a material having a lower elastic modulus than the second cathode-protecting layer 54. The first cathode-protecting layer 52 is composed of a material having an elastic modulus of 10 to 100 GPa. For example, in a bottom emission structure, Mg, Zn, Al, Ag, or the like, which is a metal material for the cathode layer may be used. In a top emission structure, an inorganic oxide such as $SiO_2$, which is a transparent inorganic compound material, or an alkali halide, such as LiF or $MgF_2$. In generals these materials having low elastic modulus often have insufficient water resistance.

As a method for forming the first cathode-protecting layer 52, a vacuum evaporation method or a high-density plasma film-forming method may be employed in order not to damage to the luminescent layers 60.

The thickness of the first cathode-protecting layer 52 is preferably about 50 to 200 nm. More preferably, the thickness of the first cathode-protecting layer 52 is larger than the thickness of the second cathode-protecting layer 54.

As shown in FIGS. 3 and 4, the second cathode-protecting layer 54 is disposed on the first cathode-protecting layer 52. The second cathode-protecting layer 54 is disposed in order to complements the deficiency of the water resistance of the first cathode-protecting layer 52 and to prevent damage due to residual water and the like in the organic buffer layer 210 to the cathode 50 during a production process. Furthermore, the second cathode-protecting layer 54 is disposed in order that when a material for forming the buffer layer is applied, the applied material exhibits satisfactory flatness, antifoaming properties, and adhesion. Furthermore, the second cathode-protecting layer 54 is disposed in order to reduce the angle defined by each side surface of the resulting buffer layer at the corresponding end of the buffer layer and the surface of the second cathode-protecting layer 54.

The second cathode-protecting layer 54 is preferably composed of a material such as a silicon compound having nitrogen, e.g., a dense silicon nitride or silicon oxynitride with high elastic modulus, in consideration of transparency, density, resistance to water, insulation properties, and gas barrier properties.

The elastic modulus of the material for forming the second cathode-protecting layer 54 is 100 GPa.

As a method for forming the second cathode-protecting layer 54, a high-density plasma film-forming method, such as ECR sputtering or ion plating, may be employed.

The thickness of the second cathode-protecting layer 54 is preferably about 10 to 50 nm.

As shown in FIGS. 3 and 4, the organic buffer layer 210 is disposed on the second cathode-protecting layer 54 and covers the organic banks 221 and the cathode 50. The organic buffer layer 210 needs not necessarily cover the entire cathode-protecting layer. When the organic buffer layer 210 may cover the cathode 53 disposed on the pixel areas 3. Alternatively, the organic buffer layer 210 may further cover the cathode 50 disposed on the cathode lead 202 at the peripheral portion of the base 200.

The organic buffer layer 210 is disposed in such a manner that irregularities of the cathode 50 caused by the shape of the organic banks 221 are filled with the organic buffer layer 210 and the top surface of the organic buffer layer 210 is substantially flat. The organic buffer layer 210 functions to relieve stress generated by warpage or volume expansion of the base 200 and to prevent the detachment of the cathode 50 from the unstable organic banks 221. Furthermore, since the top surface of the organic buffer layer 210 is substantially flat, the hard gas barrier layer 30 disposed on the organic buffer layer 210 is also flat, hence, there is no stress concentrated portion. Therefore, the occurrence of a crack in the gas barrier layer 30 is prevented.

The organic buffer layer 210 is preferably formed by screen printing on the second cathode-protecting layer 54 under reduced pressure. A mask formed of a mesh screen having a nonapplication pattern composed of a cured resin is brought into the base 200, and then the mesh screen is pressed with a squeegee, thereby transferring a material for forming the organic buffer layer onto the base 200 (second cathode-protecting layer 54). Since the application (transfer) is performed under reduced-pressure atmosphere, it is possible to remove bobbles generated on the applied surface during transfer while maintaining an environment at a low moisture content.

An uncured main material for forming the organic buffer layer 210 needs to be an organic compound material which is capable of forming a polymeric framework and which has satisfactory flowability without any solvent and volatile component. Preferably, an epoxy monomer or an epoxy oligomer having an epoxy group and having a molecular weight of 3,000 or less is used. The epoxy monomer is defined as an epoxy compound having a molecular weight of 1,000 or less, and the epoxy oligomer is defined as an epoxy compound having a molecular weight of 1,000 to 3,000. Examples of the main material include bisphenol A type epoxy oligomers, bisphenol F type epoxy oligomers, phenolic novolac type epoxy oligomers, polyethylene glycol diglycidyl ether, alkyl glycidyl ether, 3,4-epoxycyclohexenylmethyl-3',4'-epoxcycyrclohexene carboxylate, and ε-caprolactone modified 3,4-epoxycyclohexylmethyl-3',4'-epoxycyclohexane carboxylate. These may be used alone or in combination.

A curing agent that reacts with the epoxy monomer or epoxy oligomer is preferably an agent which has satisfactory electrical insulation and adhesion and which is capable of forming a cured film having high hardness, stiffness, and heat resistance. Preferably, the agent is of an addition polymerization type, the agent having satisfactory transparency and a low variation in curing. Suitable examples of the agent include acid anhydride curing agents, such as 3-methyl-1,2,3,6-tetranydrophthalic anhydride, methyl-3,6-endomethylene-1,2,3,6-tetrahydrophthalic anhydride, 1,2,4,5-benzenetetracarboxylic dianhydride, and 3,3',4,4'-benzophenonetetracarboxylic dianhydride. An alcoholic compound such as 1,6-hexanediol, which has a large molecular weight and less volatility, is further added as a reaction accelerator that promotes the reaction (ring-opening reaction) of the acid anhydride, thereby facilitating curing at a low temperature. Curing is performed in the range of 60° C. to 100° C. The resulting cured film is composed of a polymer having an ester bond.

By further adding a compound having a relatively high molecular weight, e.g., an aromatic amine, an alcohol, or an aminophenol, as a curing accelerator that promotes the ring opening of the acid anhydride, it is possible to effect curing at a low temperature and in a short period of time.

A cation-releasing photoinitiator, which is often used in order to reduce the curing time, is not preferred because of the occurrence of coloring and rapid curing shrinkage. Examples of additives that may be incorporated include a silane coupling agent for improving adhesion to the gas barrier layer 30; a water-feeding agent such as an isocyanate compound; and fine particles for preventing shrinkage during curing.

The viscosity of each material is preferably 1,000 mPa·s or more at room temperature (25° C.) in order to prevent the penetration of the material into the luminescent layer 60 immediately after application and generation of a nonluminous region, which is referred to as "dark spot". The viscosity of a buffer-layer-forming mixture containing these materials is preferably 500 to 20,000 mPa·s and particularly 2,000 to 10,000 mPa·s at room temperature.

The organic buffer layer 210 preferably has a thickness of 3 to 10 μm. At a thickness of 3 μm or more of the organic buffer layer 210, even when foreign matter is mixed, it is possible to prevent the occurrence of a defect in the gas barrier layer 30.

With respect to characteristics after curing, the organic buffer layer 210 preferably has an elastic modulus of 1 to 10 GPa. At an elastic modulus of 10 GPa or more, the organic buffer layer 210 cannot absorb stress generated in planarizing the top of the organic banks 221. At an elastic modulus of 1 GPa or less, the organic buffer layer 210 has insufficient wear resistance, heat resistance, and the like.

As shown in FIGS. 2 to 4, the gas barrier layer 30 is disposed on the organic buffer layer 210 so as to cover the luminescent layers 60, the organic banks 221, and the cathode 50. Furthermore, the gas barrier layer 30 covers throughout the organic banks 221, which have relatively lower water resistance among sealing layers, and the first cathode-protecting layer 52.

The gas barrier layer 30 is disposed in order to prevent penetration of oxygen and water, thereby suppressing the degradation due to oxygen and water of the cathode 50 and the luminescent layers 60. The gas barrier layer 30 is preferably composed of a silicon compound containing nitrogen, i.e., the gas barrier layer 30 is preferably composed of a silicon nitride or a silicon oxynitride in consideration of transparency, gas barrier properties, and water resistance.

With respect to a method for forming the gas barrier layer 30, since the gas barrier layer 30 needs to be a dense film without defect in order to block a gas such as water vapor, a high-density plasma film-forming method capable of forming a dense film at a low temperature is employed.

The gas barrier layer 30 preferably has an elastic modulus of 100 GPa or more and more preferably about 200 to 250 GPa. The gas barrier layer 30 may be composed of a material having an elastic modulus equal to that of the material of the second cathode-protecting layer 54. The gas barrier layer 30 preferably has a thickness of about 200 to 600 nm. At a thickness less than 200 nm, the gas barrier layer 30 has insufficient coverage for foreign matter. Thus, a through hole may be formed, resulting in the degradation of gas barrier properties. A thickness exceeding 600 mm may result in a stress crack.

The gas barrier layer 30 may have a laminated structure. Alternatively, the gas barrier layer 30 may have a nonuniform composition. In particular, the gas barrier layer 30 may have a structure in which the oxygen concentration varies continuously or discontinuously.

In this embodiment, the gas barrier layer 30 needs to be transparent because of a top emission structure. Thus, in this embodiment, the gas barrier layer 30 has a light transmittance of, for example, 80% or more in the visible light region by appropriately adjusting the material and the thickness.

The structure at an end (peripheral region) of the organic buffer layer 210 will be described.

Figure 5:
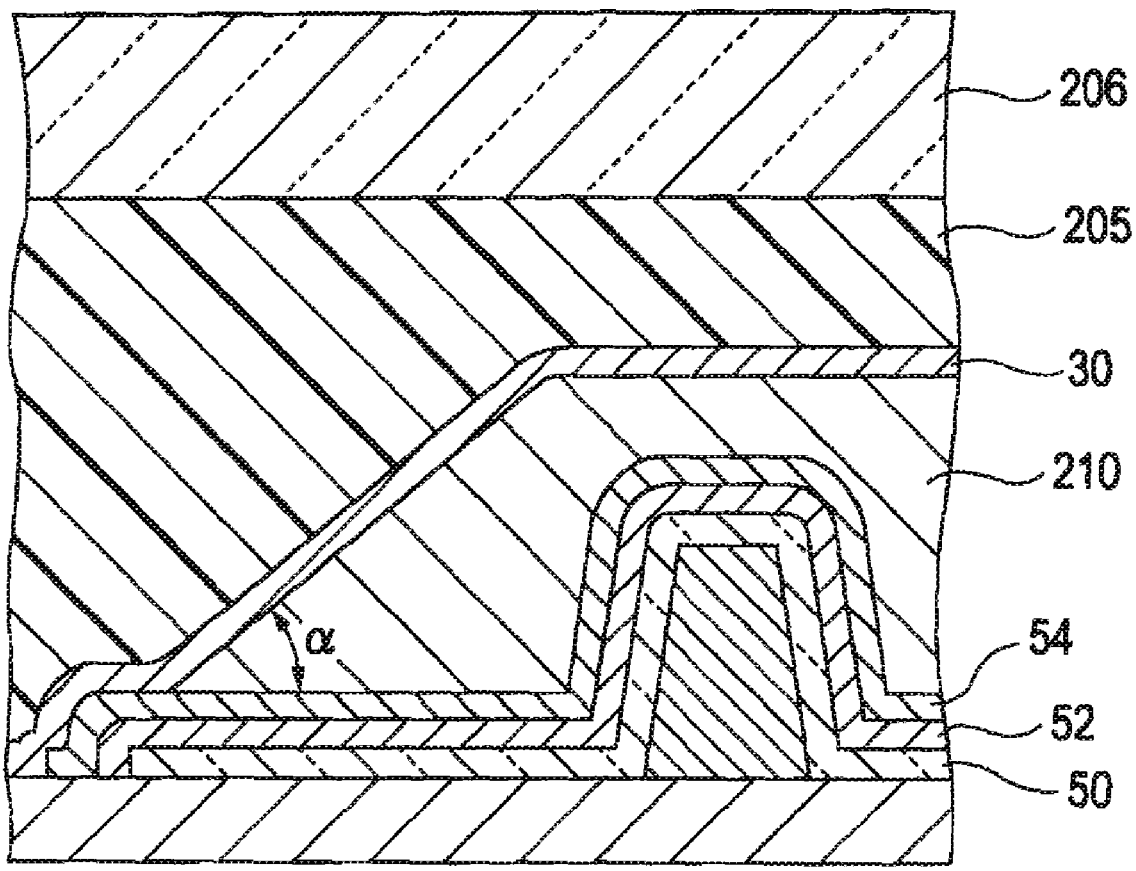
FIG. 5 is an enlarged view showing an end (peripheral region) of an organic buffer layer.

FIG. 5 is an enlarged view showing an end (peripheral region) of the organic buffer layer 210.

The organic buffer layer 210 is disposed on the second cathode-protecting layer 54. The organic buffer layer 210 is in contact with the surface of the second cathode-protecting layer 54 at each end of the organic buffer layer 210 at a contact angle α. The contact angle α is preferably 45° or less and more preferably about 1° to 20°.

The gas barrier layer 30 disposed on the organic buffer layer 210 has no steep change in shape at ends thereof. That is, the end shape of the gas barrier layer 30 varies gradually, thus preventing the occurrence of a defect such as a crack due to stress concentration. Hence, it is possible to maintain sealing properties over a prolonged period of time.

As shown in FIGS. 3 and 4, a protective layer 204 is disposed on the gas barrier layer 30 so as to cover the gas barrier layer 30. The protective layer 204 includes an adhesive sublayer 205 adjacent to the gas barrier layer 30; and a surface-protecting substrate 206.

The adhesive sublayer 205 fixes the surface-protecting substrate 206 on the gas barrier layer 30, has a cushioning capacity against mechanical shock, and protects the luminescent layer 60 and the gas barrier layer 30. The protective layer 204 is formed of the adhesive sublayer 205 bonded with the surface-protecting substrate 206. The adhesive sublayer 205 is formed of an adhesive composed of a flexible and low-glass-transition-temperature material, such as a urethane resin, an acrylic resin, an epoxy resin, or a polyolefin resin, as compared with the surface-protecting substrate 206. Furthermore, a transparent resin material is preferred. Alternatively, the adhesive sublayer 205 may be formed of a two-liquid mixed material, in which a curing agent for effecting curing at a low temperature is added.

The adhesive sublayer 205 preferably incorporates a silane coupling agent or an alkoxysilane. The incorporation results in satisfactory adhesion between the adhesive sublayer 205 and the gas barrier layer 30, thereby enhancing the cushioning capability against mechanical shock.

In particular, in the case of the gas barrier layer 30 composed of a silicon compound, the silane coupling agent and the alkoxysilane can improve the adhesion to the gas barrier layer 30, thereby enhancing the gas barrier properties of the gas barrier layer 30.

The surface-protecting substrate 206 is disposed on the adhesive sublayer 205 and constitutes the surface side of the protective layer 204. The surface-protecting substrate 206 has at least one selected from pressure resistance, wear resistance, antireflective properties against extraneous light, gas barrier properties, and ultraviolet-ray barrier properties.

Examples of the material of the surface-protecting substrate 206 include glass, diamond-like carbon (DLC), and transparent plastic materials. A transparent plastic film may also be used. Examples of the plastic material include PETs, acrylic resins, polycarbonates, and polyolefins.

The surface-protecting substrate 206 may further contain an ultraviolet-ray barrier/absorption layer, an antireflective sublayer, a heat-dissipating sublayer, a lens, a wavelength conversion sublayer, or an optical structure such as a mirror. Furthermore, the surface-protecting substrate 206 may have a color-filter function.

Since the EL display 1 is of a top emission type, both of the surface-protecting substrate 206 and adhesive sublayer 205 need to be transparent. In the case of a bottom emission type, there is no need for it.

An example of a process for producing the EL display 1 according to this embodiment will be described with reference to FIGS. 6 and 7. Each of the cross-sectional views shown in FIGS. 6 and 7 corresponds to a cross-sectional view taken along line III-III in FIG. 2.

In this embodiment, the EL display 1 of a top emission type is described as an emissive device. A step of forming the circuit portion 11 on a surface of the substrate 20 is omitted because the step is the same as the known art.

As show in FIG. 6A, a conductive film to be the pixel electrodes 23 is formed so as to cover the entire substrate 20 having the circuit portion 11 thereon. The resulting transparent conductive film is patterned to form the pixel electrodes 23 connected to the respective drain electrodes 244 via contact holes 23a in a second interlayer insulation layer 284 and to form dummy patterns 26 in a dummy region.

The pixel electrodes 23 and the dummy patterns 26 collectively means the pixel electrodes 23 in FIGS. 3 and 4. The dummy patterns 26 are not connected to lower metal leads via the second interlayer insulation layer 284. That is, the dummy patterns 26 are each disposed in an island form. The dummy patterns 26 each have substantially the same shape as each pixel electrode 23 disposed in the actual display area. Each dummy pattern 26 may have a different shape from the shape of each pixel electrode 23 disposed in the actual display area. In this case, the dummy patterns 26 include one located above at least the driving-voltage conductive lines 310 (340).

As shown in FIG. 6B, the lyophllic control layer 25, which is an insulating layer, is formed on the pixel electrodes 23, the dummy patterns 26, and the second interlayer insulation film. The lyophilic control layer 25 has openings in pixel electrodes 23. It is possible to transfer holes from the pixel electrodes 23 through the openings 25a (see FIG. 3). In contrast, in the dummy patterns 26 not having the openings 25a, the insulating layer (lyophilic control layer) 25 functions as a hole-transfer-blocking layer to prevent the hole transfer. Subsequently, a black matrix (BM, not shown) is formed in depressions of the lyophilic control layer 25, the depressions being disposed between two pixel electrodes 23. Specifically, the BM is formed by sputtering with metallic chromium at the depressions of the lyophilic control layer 25.

Figure 6C:
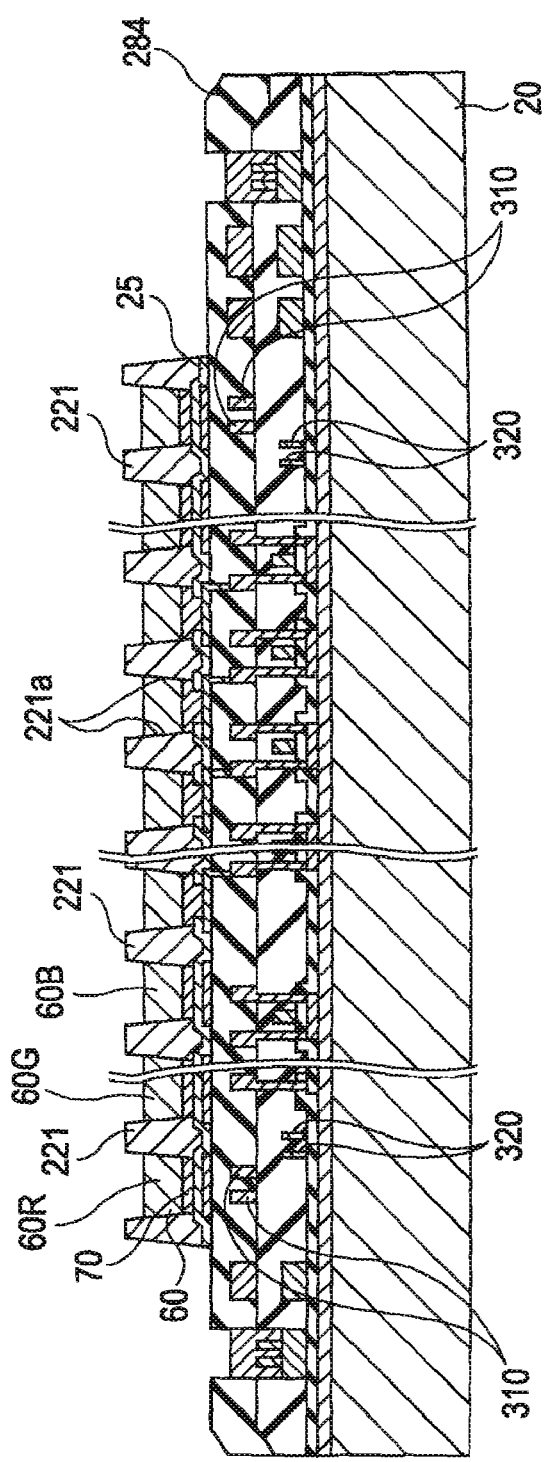

As shown in FIG. 6C, the organic banks 221 are formed on predetermined positions. Specifically, the organic banks 221 are formed so as to cover the BM.

As a specific method for forming the organic banks, for example, a solution of a resist, such as an acrylic or imide material, in a solvent is applied by a coating method, such as spin coating or dip coating, to form an organic resin layer. Any material may be used for the organic resin layer as long as the material is not dissolved in a solvent for ink described below and the organic resin layer is easily patterned by etching or the like.

Furthermore, the resulting organic resin layer is patterned by photolithography and etching to form openings 221a in the organic resin layer, thereby forming the organic banks 221 having walls in the openings 221a. With respect to the walls constituting the openings 221a, each of the walls is formed in such a manner that the angle defined by the wall and the surface of the base 200 is in the range of 110° to 170°.

In this case, the organic banks 221 include one located above at least the driving-control-signal conduction lines 320.

A lyophilic region and a lyophobic region are formed on the surface of each organic bank 221. In this embodiment, these regions are formed by plasma treatment. Specifically, the plasma treatment includes a preliminary heating step; a step of imparting an affinity for ink to top surfaces of the organic banks 221, wall surfaces of the openings 221a, electrode surfaces 23c of the pixel electrodes 23, and the top surface of the lyophilic control layer 25; a step of imparting an ink repellency to top surfaces of the organic banks 221 and walls of the openings 221a; and a cooling step.

Next, the hole transport layers 70 are formed in a step of forming the hole transport layers. In the step of forming the hole transport layer, a material for forming the hole transport layers is applied by spin coating, a droplet discharging method such as an inkjet method, or the like on the electrode surfaces 23c, dried, and heated to form the hole transport layers 70 on the pixel electrodes 23.

Next, the luminescent layers 60 are formed in a step of forming the luminescent layers. In the step of forming the luminescent layers, a material for forming the luminescent layers is discharged by an inkjet method or the like onto the hole transport layers 70, dried, and heated to form the luminescent layers 60 in the openings 221a surrounded by the organic banks 221. In the step of forming the luminescent layers, a nonpolar solvent that does not dissolve the hole transport layers 70 is used as a solvent for the luminescent-layer-forming material in order to prevent the redissolution of the hole transport layers 70.

Figure 6D:
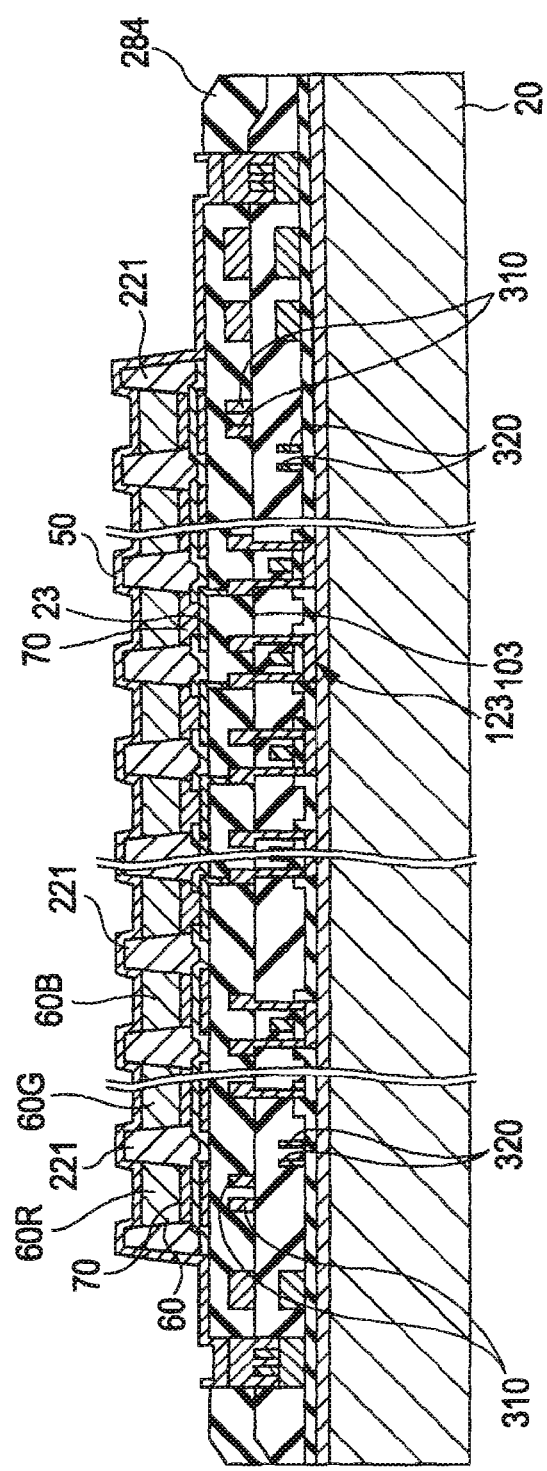

As shown in FIG. 6D, the cathode 50 is formed in a step of forming a cathode layer. In the step of forming the cathode layer, an ITO film is formed by physical vapor deposition such as ion plating to form the cathode 50. In this case, the cathode 50 is formed so as to cover wall surfaces of outer sides of the outermost organic banks 221 as well as top surfaces of the luminescent layers 60 and top surfaces of the organic banks 221.

Figure 7A:
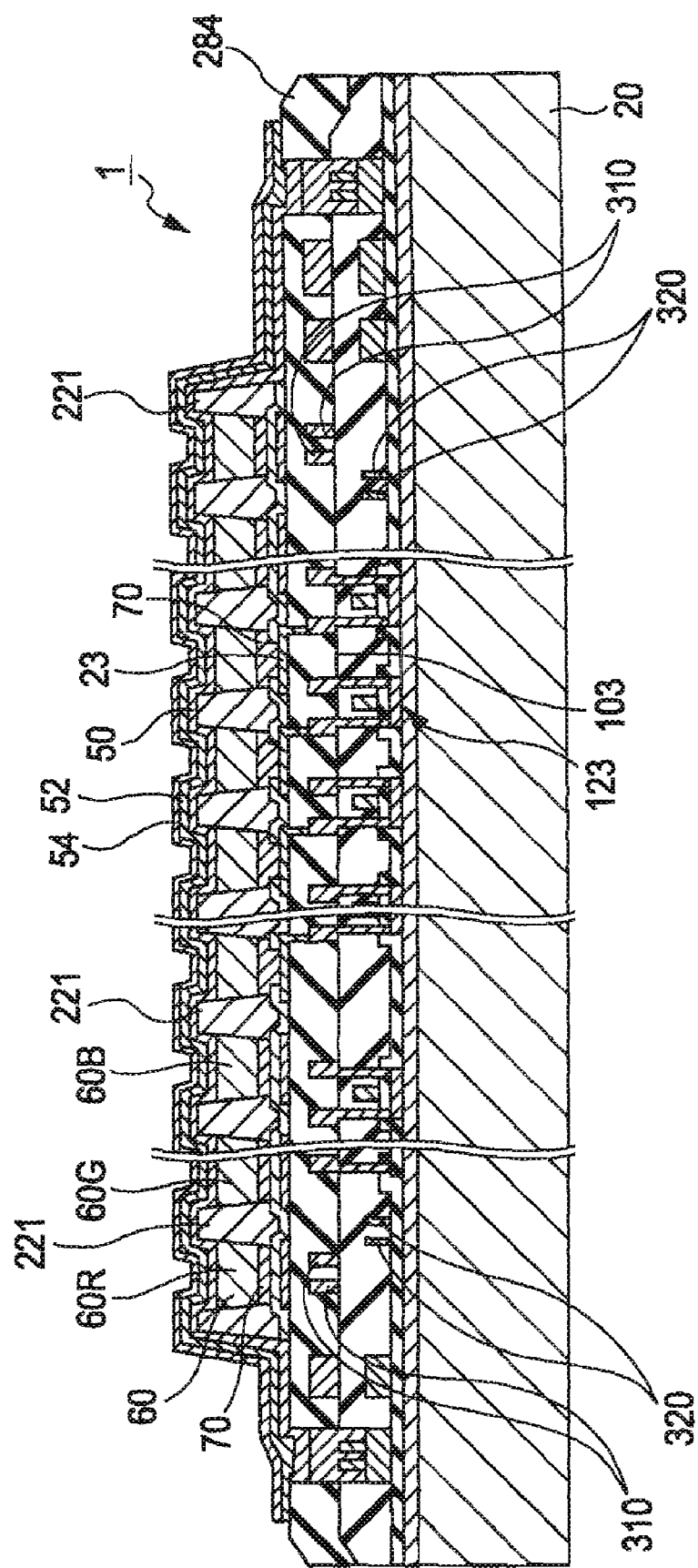
FIGS. 7A to 7C show steps subsequent to the steps shown in FIG. 6.

As shown in FIG. 7A, the first cathode-protecting layer 52 and the second cathode-protecting layer 54 are formed on the cathode 50.

For example, a film composed of an inorganic material, such as Mg, Zn, Al, or Ag; an inorganic oxide, such as $SiO_2$, which is a transparent inorganic material; or an alkali halide, such as LiF or $MgF_2$; is formed by vacuum evaporation or a high-density plasma film-forming method so as to have a thickness of about 50 to 200 nm.

Subsequently, a film composed of an inorganic compound, such as a silicon compound containing nitrogen, i.e., silicon nitride, is formed by ECR sputtering or a high-density plasma film-forming method such as ion plating so as to have a thickness of about 10 to 50 nm.

The first cathode-protecting layer 52 and the second cathode-protecting layer 54 can be successively formed in the same process chamber with the same mask. Accordingly, it is possible to efficiently form the first cathode-protecting layer 52 and the second cathode-protecting layer 54.

Figure 7B:
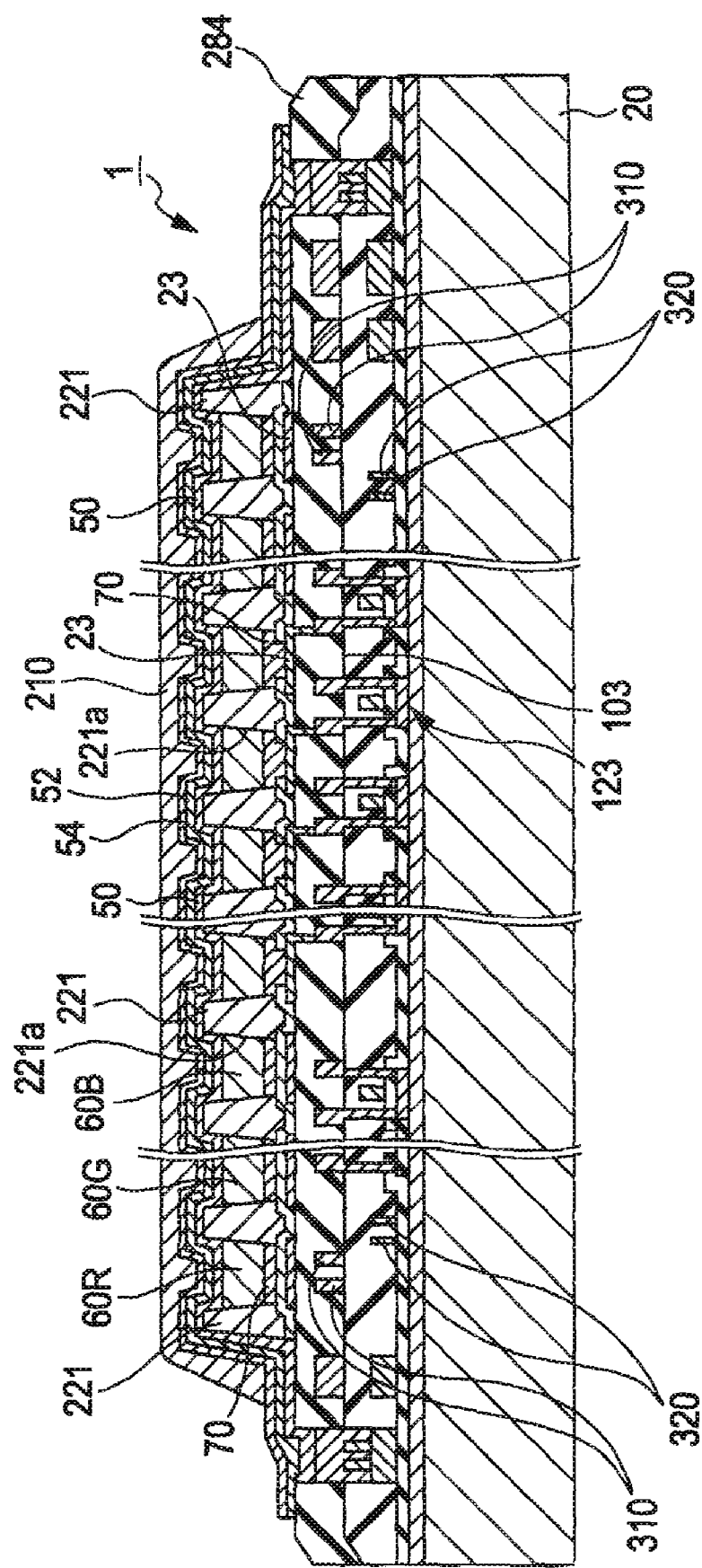

As shown in FIG. 7B, a material for forming the organic buffer layer 210 is applied by screen printing on the second cathode-protecting layer 54. In this case, the material is applied under a pressure of 100 to 10,000 Pa in order to prevent the occurrence of a film defect due to a bubble.

The procedure of the formation of the organic buffer layer 210 by screen printing under reduced-pressure atmosphere will be described in detail.

FIGS. 8A to 8K show steps of screen printing.

Screen printing is a method in which application can be performed under reduced-pressure atmosphere. Thus, a coating liquid having relatively middle to high viscosity is suitably used in screen printing. In particular, screen printing has advantages that coating is easily controlled by motion and press of a squeegee; and the use of a mesh screen results in excellent patterning properties and a satisfactory uniformity in thickness.

As shown in FIG. 8A, the base 200 in which the process from the beginning to the steps of forming the first cathode-protecting layer 52 and the second cathode-protecting layer 54 are finished is transferred into a first substrate transfer chamber (not shown). After the pressure in the first substrate transfer chamber and a coating chamber (not shown) is regulated to a predetermined pressure, the base 200 is transferred into the coating chamber.

As shown in FIG. 8B, the base 200 is aligned with a mesh screen 551. The mesh screen 551 has a lyophobic hardened emulsion layer 551n constituting a portion that does not pass the material.

The pattern formed in the mesh screen 551 has a shape such that a predetermined shape (for example, wave shape) is formed at the periphery of the organic buffer layer 210.

After alignment of the base 200, the base 200 is held on a stage (not shown). The base 200 may be held by vacuum aspiration or the like on the stage.

As shown in FIG. 8C, in a first pressure-regulating step, the pressure in the coating chamber is regulated to 10 to 1,000 Pa before dropping of a material of the buffer layer onto the mesh screen 551.

As shown in FIG. 8D, a predetermined amount of an uncured material K of the buffer layer is dropped from the nozzle of a dispenser onto an end (onto the hardened emulsion layer 551n) of the mesh screen 551.

As described above, the material K of the buffer layer is a mixture of an epoxy monomer/oligomer materials, a curing agent, and a reaction accelerator. These materials are mixed prior to use and then applied. The mixture preferably has a viscosity of 500 to 20,000 mPa·s at room temperature (25° C.). A viscosity lower than the range causes dripping from the mesh screen 551 or flow onto the hardened emulsion layer 551n, thus degrading thickness stability and patterning properties. A viscosity exceeding the range degrades flatness, thus leaving mesh marks. Furthermore, since bobbles generated during the detachment of the meshes grow largely, a cratered surface is easily formed. Moreover, bubbles easily remain after a defoaming step.

The material K of the buffer layer particularly preferably has a viscosity of 2,000 to 10,000 mPa·s. A viscosity less than 10,000 mPa·s can further suppress the residual bubbles. At a viscosity exceeding 1,000 mPa·s, bubbles does not easily burst, and a cratered defect does not easily occur. Thus, it is possible to form a uniform film. As described below, it is possible to surely suppress the occurrence of a dark spot. That is, by setting the viscosity of the material at room temperature within the range described above, it is possible to surely achieve the retention of the shape of the buffer layer, the flatness of the surface, the minimization of bubbles, and a reduction in angle defined by the side surface of the buffer layer at each end of the buffer layer and the surface of the second cathode-protecting layer. Furthermore, the occurrence of the dark spot can be suppressed.

The organic buffer layer 210 needs to have a larger thickness than the height of each organic bank 221 in order to relieve stress generated by planarization and the irregularities. As described above, the thickness is preferably about 3 to 10 μm. Control of the viscosity and the thickness affects the contact angle and is important to achieve a contact angle of 20° or less at each end of the buffer layer. No stress is preferred. However, slight tensile stress may occur. To minimize stress, a porous film having relatively low density is preferred. As described above, the elastic modulus is preferably in the range of 1 to 10 GPa.

As shown in FIG. 8E, a squeegee 553 is moved from one end to the other on the mesh screen 551 to squeeze the material K of the buffer layer onto the base 200 while spreading the material K on the mesh screen 551, thus transferring a pattern. When the mesh screen 551 is disposed on the base 200, the mesh screen 551 may be in complete contact with the base 200 or may be remote from the base 200 at a distance of about 1 mm. Even when the mesh screen 551 is remote from the base 200, the mesh screen 551 is substantially in contact with the base 200 via the material after squeezing the material with the squeegee 553. This is contact mode screen printing. Thus, a step of detaching the mesh screen is required, as described below.

In this case, bubbles are included in the material K of the buffer layer because the material K is applied with rolling. As shown in FIG. 8F, the bubbles are removed during a second pressure-regulating step of regulating the pressure in the coating chamber to 2,000 to 5,000 Pa and maintaining the pressure for a predetermined period of time. That is, the pressure in the coating chamber is increased from a first regulation pressure of 10 to 1,000 Pa to 2,000 to 5,000 Pa by a nitrogen gas purge into the coating chamber. The bubbles are vacuum bubbles. Thus, an increase in pressure can break and eliminate the bubbles.

As shown in FIG. 8G, the mesh screen 551 is detached from the base 200. In this case, for example, when the stage moves down to detach the stage from the mesh screen 551 while the squeegee 553 is pressed at one end of the base 200 against the stage, the detachment of the mesh screen 551 starts from the opposite side of the supporting point against which the squeegee 553 is pressed. When the mesh screen 551 is actually detached, the pressure in the coating chamber is particularly preferably regulated in the range of 3,000 to 4,000 Pa. The base 200 is drawn by the mesh screen 551 during detachment, and great force to remove the base 200 from the stage is applied. When the pressure in the coating chamber is 3,000 to 4,000 Pa or more at this point, the base 200 is surely fixed on the stage by vacuum aspiration. Thus, it is possible to detach the mesh screen 551 without problem.

As shown in FIG. 8H, the stage is continued to move down. When the mesh screen 551 is completely detached from the base 200, the detachment is completed.

As shown in FIG. 8I, after the completion of the application of the material K of the buffer layer by printing, the base 200 is transferred into a second substrate transfer chamber. As shown in FIG. 8J, the pressure in the second substrate transfer chamber is regulated to atmospheric pressure as a third regulation pressure while holding the base 200 in the second substrate transfer chamber. The pressure is maintained for a predetermined period of time to remove bubbles. That is, the pressure in the second substrate transfer chamber is regulated to atmospheric pressure by nitrogen gas purge into the second substrate transfer chamber. In other words, the pressure in the chamber containing the substrate is increased from a second regulation pressure of 2,000 to 5,000 Pa to atmospheric pressure.

As shown in FIG. 8K, after the base 200 is transferred from the second substrate transfer chamber into a heating chamber, the material K of the buffer layer is heated in the range of 60° C. to 100° C. to effect curing of the material K of the buffer layer. In the curing step, the epoxy monomer/oligomer material, the curing agent, and the reaction accelerator contained in the uncured material K of the buffer layer react with each other. Three-dimensional cross-linking of the epoxy monomer/oligomer forms an epoxy resin.

Furthermore, the heat treatment not only results in curing but also changes the shape of the material K of the buffer layer at each end of the material K. As a result, the angle at each end is 20° or less (see FIG. 5). This shape is a final shape of the organic buffer layer 210.

Figure 7C:
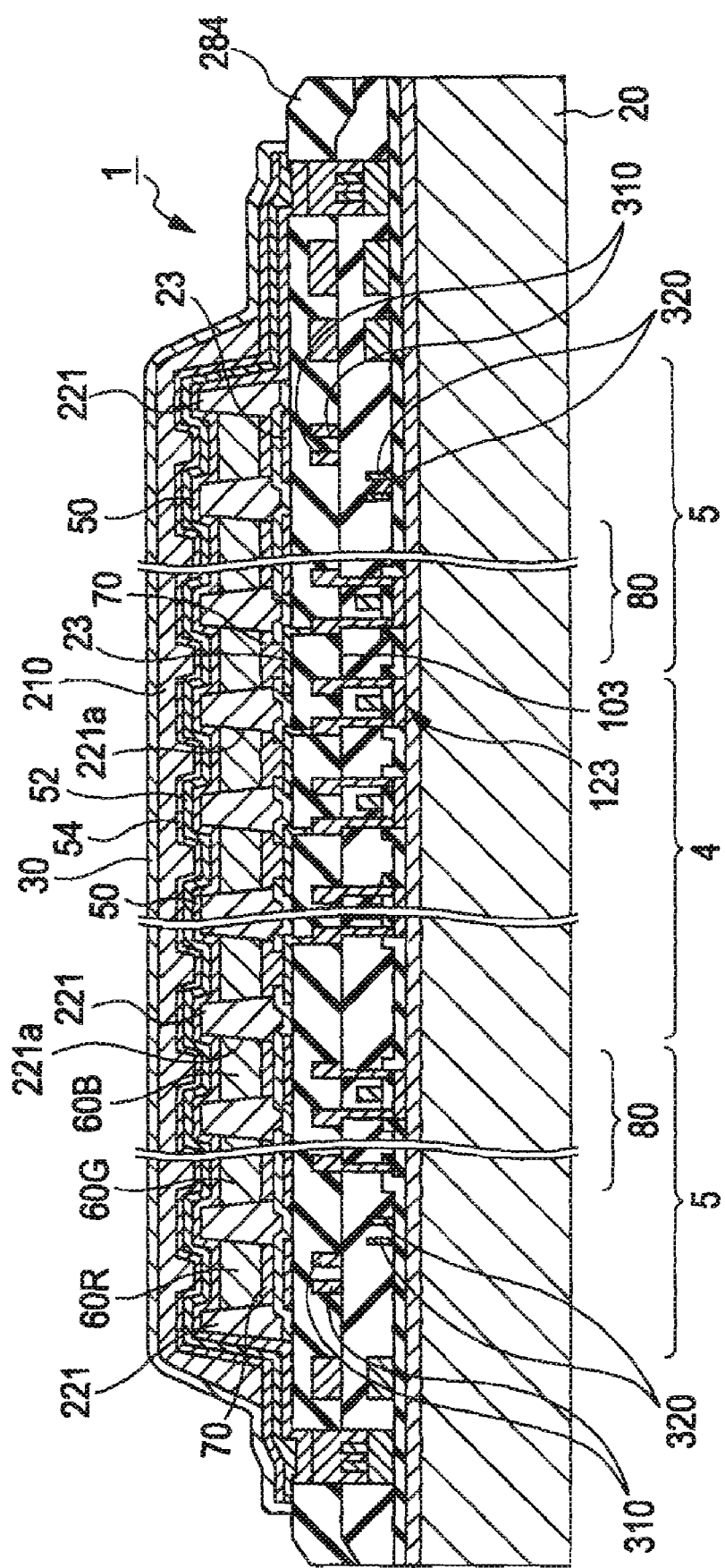

Referring to FIG. 7C, the gas barrier layer 30 is formed so as to cover the organic buffer layer 210. The gas barrier layer 30 is formed by a high-density plasma film-forming method or the like under reduced pressure. The gas barrier layer 30 is preferably formed of a transparent thin film mainly composed of a silicon nitride or a silicon oxynitride. Furthermore, the gas barrier layer 30 is a dense film sufficient for completely blocking water vapor, which is constituted of small molecules. The gas barrier layer 30 preferably has slight tensile stress. The gas barrier layer 30 preferably has a density of 2.3 g/cm$^3$ or more and an elastic modulus of 100 GPa or more. The total thickness of the gas barrier layer 30 and an inorganic buffer layer is preferably 1,000 nm or less and more preferably 20 to 600 nm.

With respect to a specific method for forming the gas barrier layer 30, deposition may be performed by physical vapor deposition, such as sputtering or ion plating, and then by chemical vapor deposition (CVD), such as plasma-enhanced CVD. In physical vapor deposition, such as sputtering or ion plating, a dense film having relatively high adhesion to a surface of a heterogeneous substrate is formed without harmful gas source. In chemical vapor deposition, an excellent dense film having less deficiency, excellent step coverage, low stress is formed at a high deposition rate. These methods may be appropriately selected in consideration of mass productivity.

As described above, the gas barrier layer 30 may have a single-layer structure composed of a single material. Alternatively, the gas barrier layer 30 may have a multilayer structure in which a plurality of sublayers are composed of different materials. Furthermore, the gas barrier layer 30 may have a single-layer structure in which the composition varies continuously or discontinuously across the thickness direction.

The protective layer 204 constituted of the adhesive sublayer 205 and the surface-protecting substrate 206 is formed on the gas barrier layer 30 (see FIGS. 3 and 4). A material of the adhesive sublayer 205 is applied by screen printing, slit coating, or the like on the gas barrier layer 30 to form a substantially uniform film. The surface-protecting substrate 206 is bonded on the resulting film.

By providing the protective layer 204 on the gas barrier layer 30, the luminescent layer 60, the cathode 50, and the gas barrier layer can be protected by the surface-protecting substrate 206 because the surface-protecting substrate 206 has pressure resistance, wear resistance, antireflective properties, gas barrier properties, ultraviolet-ray barrier properties, and the like. Thus, it is possible to prolong the lifetime of the luminescent elements.

Furthermore, the adhesive sublayer 205 exerts a cushioning function against mechanical shock. Thus, when mechanical shock is applied from the exterior, the adhesive sublayer 205 relieves mechanical shock against the gas barrier layer 30 and the luminescent elements disposed under the gas barrier layer 30, thus preventing degradation due to the mechanical shock off the luminescent elements.

Thereby, the EL display 1 is produced.

Second Embodiment

An EL display 2 according to a second embodiment of the invention will be described below. In this embodiment, the same elements as the first embodiment are designated using the same reference numerals, and redundant description is not repeated.

Figure 9:
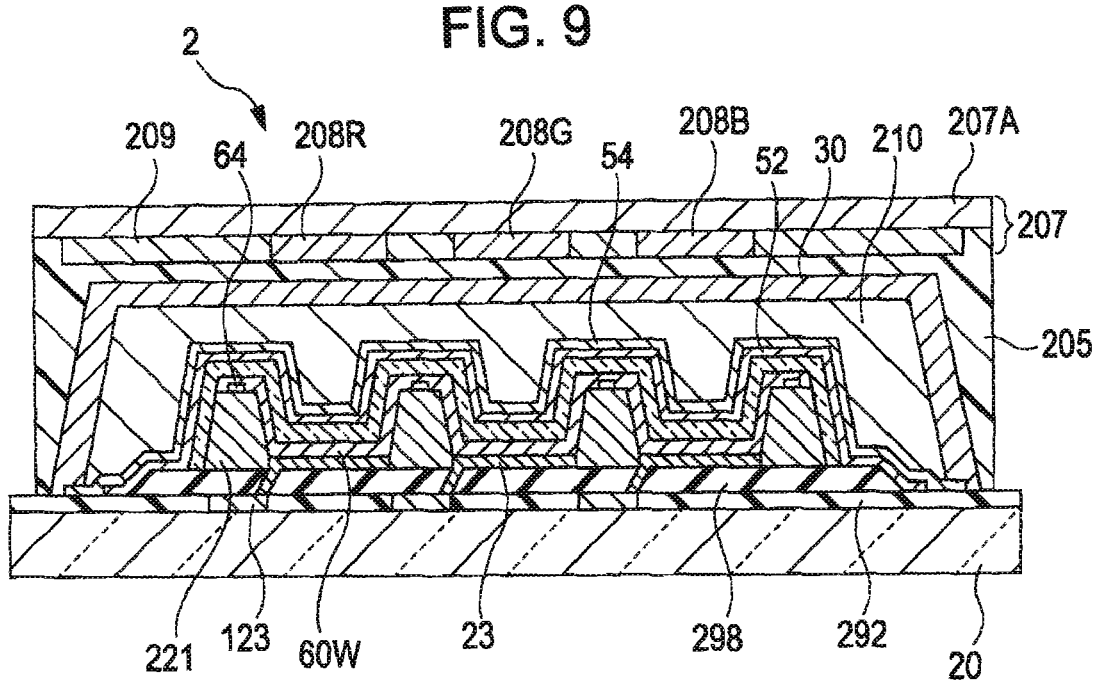
FIG. 9 is a schematic view showing the cross-sectional structure of an EL display according to a second embodiment of the invention.
Figure 10:
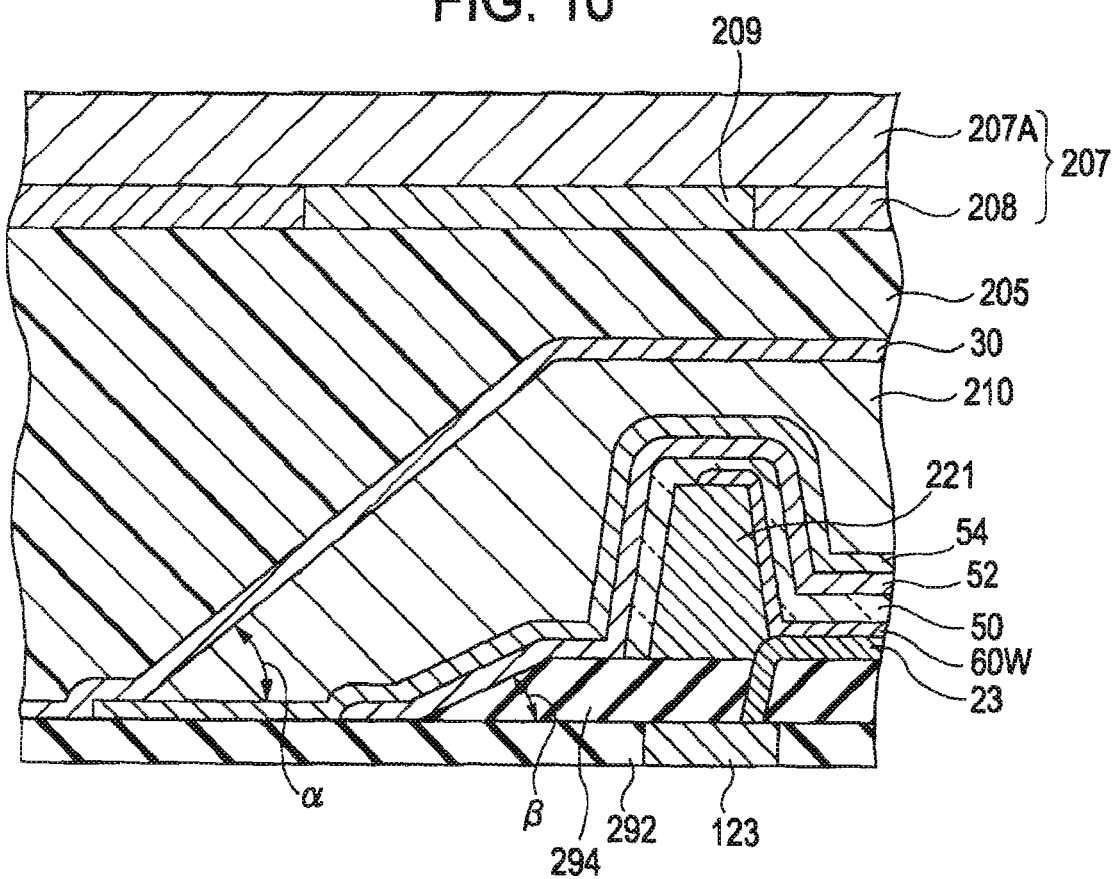
FIG. 10 is an enlarged view showing an end (peripheral region) of the organic buffer layer.

FIG. 9 is a schematic cross-sectional view of the EL display 2 according to the second embodiment of the invention. FIG. 10 is an enlarged view showing an end (peripheral region) of the organic buffer layer 210 in the EL display 2.

The EL display 2 differs from the EL display 1 according to the first embodiment in that a white-light-emitting layer 60W that emits white light is used as the luminescent layer; and a color filter substrate 207 is used as the surface-protecting substrate.

Examples of a white-light-emitting organic material include a styrylamine-based luminescent material and an anthracene-based dopamine (blue); and a styrylamine-based luminescent material and a rubrene-based dopamine (yellow).

A polymeric triarylamine (ATP) hole injection layer, a triphenyldiamine (TDP)-based hole transport layer, aluminum quinolinol (Alq3) layer (electron transport layer), and a LiF layer (electron injection buffer layer) is preferably formed on or below the white-light-emitting layer 60W.

The luminescent layers 60 are separated into R, G, and B segments in the EL display 1 according to the first embodiment. In the second embodiment, there is no need for segmentation. Thus, the white-light-emitting layer 60W may be disposed on the pixel electrodes 23 so as to cover the organic banks 221.

The cathode 50, the first cathode-protecting layer 52, and the second cathode-protecting layer 54 are disposed on the white-light-emitting layer 60W.

Auxiliary electrodes 64 composed of a metal material such as aluminum may be disposed on top surfaces of the organic banks 221. The auxiliary electrodes 64 each have a lower resistivity than the cathode 50. The auxiliary electrodes 64 prevent a drop in voltage due to high-resistivity cathode 50 by electrically connecting each auxiliary electrode 64 to part of the corresponding cathode 50.

The color filter substrate 207 includes a red-colored layer 208R, a green-colored layer 208G, a blue-colored layer 208B, and a black matrix 209, which are disposed on a substrate main body 207A. Surfaces of the colored layers 208R, 208G, and 208B and the black matrix 209 are opposite the base 200 via the adhesive layer 205. The substrate main body 207A may be composed of the same material as the surface-protecting substrate 206 according to the first embodiment.

Each of the colored layers 208R, 208G, and 208B is opposite the white-light-emitting layer 60W disposed on the pixel electrodes 23. Light emitted from the white-light-emitting layer 60W passes through each of the colored layers 208R, 208G, and 208B into red light, green light, and blue light, which emerge from the viewer side.

In the EL display 2, light emitted from the white-light-emitting layer 60W is used, and a color image is displayed with the color filter substrate 207 having the colored layers 208R, 208G, and 208B.

The distance between the white-light-emitting layer 60W and each of the colored layers 208R, 208G, and 208B is required to be minimized in such a manner that light emitted from the white-light-emitting layer 60W is incident on only the opposite colored layer. A long distance therebetween increases the likelihood that light emitted from the white-light-emitting layer 60W is incident on adjacent colored layers. To suppress this phenomenon, the distance is preferably minimized.

Specifically, the distance between the surface of the insulation layer 284 and the color filter substrate 207 is preferably about 15 μm. As a result, light emitted from the white-light-emitting layer 60W is incident on only the opposite colored layer. That is, this structure can suppress leakage of the emitted light to adjacent colored layers. Therefore, color mixing can be suppressed.

The use of the white-light-emitting layer 60W, which is a single color, eliminates the need for separation of the R, G, and B luminescent layers. Specifically, in a mask evaporation step of forming a white-light-emitting layer composed of a low-molecular-weight compound and in a droplet discharging step of forming a white-light-emitting layer composed of a polymer, a single type of white-light-emitting layer may be formed in a single step, thus facilitating the production process compared with the case in which the R, G, and B luminescent layers are separated. Furthermore, it is possible to suppress a variation in the lifetime of each luminescent layer 60.

Also in the EL display 2 as shown in FIG. 10, the organic buffer layer 210 is disposed on the second cathode-protecting layer 54. The organic buffer layer 210 is in contact with the surface of the second cathode-protecting layer 54 at each end of the organic buffer layer 210 at a contact angle α. The contact angle α is preferably 45° or less and more preferably about 1° to 20°.

The gas barrier layer 30 disposed on the organic buffer layer 210 has no steep change in shape at ends thereof. That is, the end shape of the gas barrier layer 30 varies gradually, thus preventing the occurrence of a defect such as a crack due to stress concentration. Hence, it is possible to maintain sealing properties over a prolonged period of time.

A planarizing insulation film 294 is disposed on an interlayer insulation film 292. The contact angle β at an end of the planarizing insulation film 294 is 45° or less in such a manner that the shapes of the first cathode-protecting layer 52 and the second cathode-protecting layer 54 disposed on the planarizing insulation film 294 vary gradually.

This structure prevents the occurrence of a defect such as a crack due to stress concentration in the first cathode-protecting layer 52 and the second cathode-protecting layer 54 disposed on the planarizing insulation film 294.

EXAMPLE

The presence or absence of the occurrence of a defect when the first cathode-protecting layer 52 and the second cathode-protecting layer 54 are disposed on the cathode 50 will be described below.

FIG. 11 is a table showing the presence or absence of the occurrence of a defect when the first cathode-protecting layer 52 is disposed on the organic banks 221 having a bump of about 3 μm, the luminescent layer 60 covering the organic banks 221 and having a mutilayer structure, and the cathode 50 composed of a magnesium-silver alloy and having a thickness of 10 nm.

Specifically, the first cathode-protecting layer 52 was formed with any one of the materials described in FIG. 11. When the second cathode-protecting layer 54, the organic buffer layer 210, and the gas barrier layer 30 were laminated, the presence or absence of the occurrence of a defect in the cathode 50 or the second cathode-protecting layer 54 was checked. In particular, whether or not detachment or a crack occurs in the vicinity of the luminescent layer 60 or the white-light-emitting layer 60w of the cathode 50 or the second cathode-protecting layer 54 was observed.

The second cathode-protecting layer 54 was composed of a silicon oxynitride ($SiO_xN_y$).

As shown in FIG. 11, when the first cathode-protecting layer 52 was composed of an alkali halide, such as LiF or $MgF_2$, or an inorganic material, such as Mg, Zn, Al, Ag, or $SiO_2$, there was no defect, such as detachment, a crack, or abnormal luminescence, in the vicinity of the luminescent layer 60 or the white-light-emitting layer 60W of the cathode 50 or the second cathode-protecting layer 54. These materials each have an elastic modulus of 10 to 100 GPa.

On the other hand, when the first cathode-protecting layer 52 was composed of an inorganic material, such as Ti, Pt, MgO, $SiO_xN_y$, $Si_3N_4$, or $Al_2O_3$, there was a defect, such as detachment, a crack, or the shrink of a luminescent pixel, in the vicinity of the luminescent layer 60 or the white-light-emitting layer 60W of the cathode 50 or the second cathode-protecting layer 54. These materials each have an elastic modulus of 100 GPa or more.

The formation of the first cathode-protecting layer 52 having low elastic modulus and the second cathode-protecting layer 54 having high elastic modulus on the cathode 50 can easily prevent the occurrence of a defect in the vicinity of the luminescent layer 60 or the white-light-emitting layer 60W of the cathode 50 or the second cathode-protecting layer 54 during a production process, in particular, during the step of forming the organic buffer layer 210.

In each of the EL displays 1 and 2 according to the embodiments, the top emission EL displays have been described. However, the invention is not limited thereto. The invention may be applied to a bottom emission EL display. Furthermore, the invention may also be applied to an EL display in which light emerges from both sides.

In the case of a bottom emission EL display or an EL display in which light emerges from both sides, the switching TFTs 112 and the driving TFTs 123 disposed on the base 200 are not disposed directly below the luminescent elements. The switching TFTs 112 and the driving TFTs 123 are preferably disposed directly below the lyophilic control layer 25 and the organic banks 221, thereby increasing the aperture ratio.

In each of the EL displays 1 and 2, the first electrode functions as an anode, and the second electrode functions as a cathode. Alternatively, a structure in which the first electrode functions as a cathode and the second electrode functions as an anode may be used. In this case, each luminescent layer 60 and the corresponding hole transport layer 70 needs to change places.

In the embodiments, each of the EL displays 1 and 2 was exemplified as the emissive device. However, the invention is not limited thereto. Basically, the invention may be applied to any emissive device as long as the second electrode is disposed outside the base.

As a method for measuring elastic modulus of the first cathode-protecting layer 52, the second cathode-protecting layer 54, the organic buffer layer 210, the gas barrier layer 30, and the like of each of the EL displays 1 and 2, for example, a nanoindentation method may be employed.

The nanoindentation method is a method in which an indenter is pressed into a sample while the indenter is controlled with a high degree of accuracy, and then mechanical properties, such as hardness and elastic modulus, is quantitatively measured from the analysis of a load displacement curve. In particular, a thin-film samples, which has been difficult to measure in the past, can be measured by the method. Furthermore, the method is easy and has high reproducibility; hence, the elastic modulus of the first cathode-protecting layer 52 or the like can be suitably measured by the method.

An electronic apparatus according to the invention will be described below.

The electronic apparatus includes the EL display 1 or 2 as a display. Examples of the electronic apparatus include apparatuses shown in FIGS. 12A to 12D.

Figure 12A:
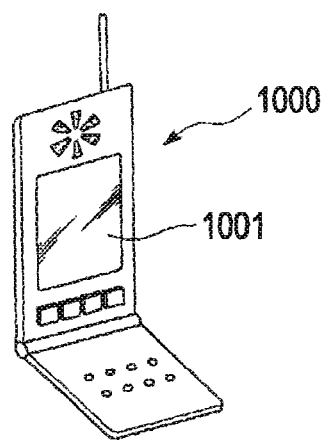
FIGS. 12A too 12D each show an electronic apparatus according to an embodiment of the invention.

FIG. 12A is a perspective view of an example of a mobile phone. In FIG. 12A, a mobile phone 1000 includes a display 1001 using the EL display 1 described above.

Figure 12B:
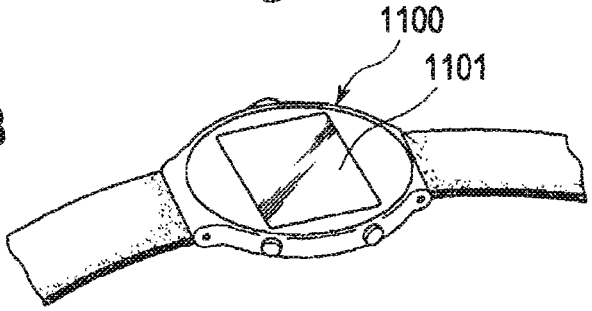

FIG. 12B is a perspective view of an example of a wristwatch electronic apparatus. In FIG. 12B, a wristwatch (electronic apparatus) 1100 includes a display 1101 using the EL display 1 described above.

Figure 12C:
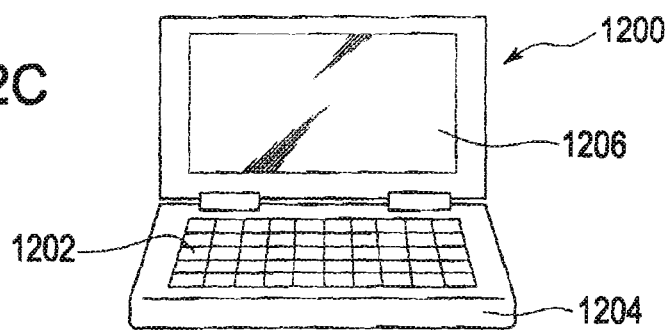

FIG. 12C is a perspective view of an example of a portable information-processing apparatus, such as a word processor or a personal computer. In FIG. 12C, an information-processing apparatus 1200 includes an input unit 1202 such as a keyboard, a display 1206 using the EL display 1 described above, and a main body (case) 1204.

Figure 12D:
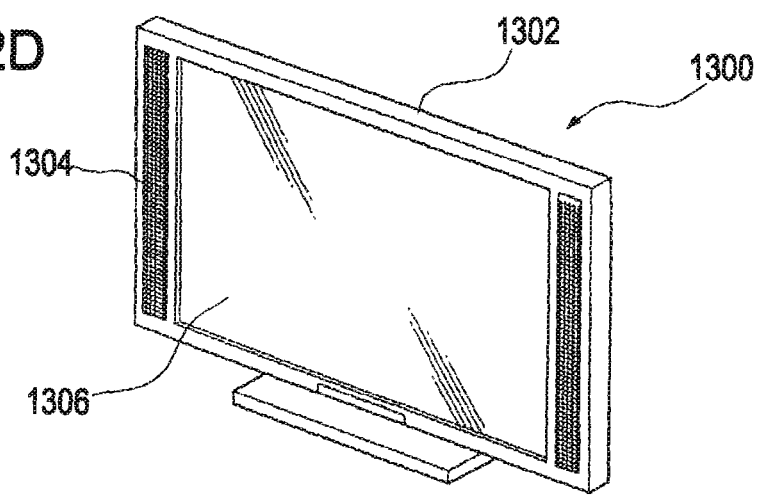

FIG. 12D is a perspective view of an example of a thin big screen TV set 1300 includes a main body (case) 1302, an audio output unit 1304 such as a speaker, and a display 1306 using the EL display 1 described above.

Each of the electronic apparatuses shown in FIGS. 12A to 12D includes the display 1001, 1101, 1206, or 1306 using the EL display 1 or 2, thus prolonging the lifetime of the display.

In the thin big screen TV set 1300 shown in FIG. 12D, the invention capable of sealing a display regardless of an area is applied. Thus, the display 1306 has a large for example, a diagonal diameter of 20 in. or more) compared with the known art.

The invention is not limited to the case including the EL display 1 or 2 as a display. An electronic apparatus may include the EL display 1 or 2 as a light-emitting unit. For example, the electronic apparatus may be a page printer (image-forming apparatus) including the EL display 1 as an exposure head (line head).

What is claimed is:

1. An emissive device comprising:
   a first substrate;
   a first electrode;
   a pixel bank having an opening that corresponds to the position of the first electrode;
   an organic function layer disposed in the opening;
   a second electrode disposed so as to cover the pixel bank and the organic function layer;
   a first inorganic layer disposed on the second electrode;
   a second inorganic layer disposed on the first inorganic layer;
   an organic buffer layer disposed on the second inorganic layer;
   a gas barrier layer disposed on the organic buffer layer; and
   a second substrate opposed to the gas barrier layer and disposed above the first substrate,
   the first inorganic layer including a material having an elastic modulus that is lower than an elastic modulus of the second inorganic layer, wherein the gas barrier is in direct contact with the organic buffer layer.

2. The emissive device according to claim 1, wherein the second electrode is composed of a light-transmitting thin metal film and/or a light-transmitting conductive metal oxide film, and the first inorganic layer and the second inorganic layer are each composed of an insulating inorganic compound.

3. The emissive device according to claim 1, wherein the first inorganic layer is composed of a material having a higher elastic modulus than the organic buffer layer.

4. The emissive device according to claim 1, wherein the first inorganic layer is composed of a material having an elastic modulus of 10 to 100 GPa.

5. The emissive device according to claim 1, wherein the thickness of the first inorganic layer is larger than the thickness of the second inorganic layer and smaller than the thickness of the organic buffer layer.

6. The emissive device according to claim 1, wherein the first inorganic layer completely covers the organic function layer, the pixel bank, and the second electrode and is entirely covered by the gas barrier layer.

7. The emissive device according to claim 1, wherein the first inorganic layer is composed of an inorganic oxide or an alkali halide.

8. The emissive device according to claim 1, wherein the second inorganic layer has substantially the same elastic modulus as the gas barrier layer.

9. The emissive device according to claim 1, wherein the organic buffer layer is composed of an epoxy resin.

10. The emissive device according to claim 1, wherein the contact angle defined by the surface of the organic buffer layer at each end of the organic buffer layer and a surface of the second inorganic layer is 20° or less.

11. A process for producing an emissive device, comprising:
forming a first electrode on a first substrate;
forming a pixel bank having an opening corresponding to the position of the first electrode;
forming an organic function layer in the opening;
forming a second electrode in such a manner that the second electrode covers the pixel bank and the organic function layer;
forming a first inorganic layer on the second electrode;
forming a second inorganic layer on the first inorganic layer;
forming an organic buffer layer on the second inorganic layer;
forming a gas barrier layer on the organic buffer layer; and
forming a second substrate opposed to the gas barrier layer and disposed above the substrate,
the first inorganic layer including a material having an elastic modulus that is lower than an elastic modulus of the second inorganic layer, wherein the gas barrier is in direct contact with the organic buffer layer.

12. The process for producing an emissive device according to claim 11, wherein the first inorganic layer is composed of a material having a higher elastic modulus than the organic buffer layer.

13. The process for producing an emissive device according to claim 11, wherein the first inorganic layer is composed of a material having an elastic modulus of 10 to 100 GPa.

14. The process for producing an emissive device according to claim 11, wherein the first inorganic layer and the second inorganic layer are successively formed in the same film-forming apparatus.

15. The process for producing an emissive device according to claim 11, wherein the organic buffer layer is formed by screen printing under a reduced-pressure atmosphere.

16. An electronic apparatus including the emissive device according to claim 1.

17. An emissive device comprising:
a first substrate;
a first electrode
a pixel bank having an opening that corresponds to a position of the first electrode;
an organic function layer disposed in the opening;
a second electrode disposed so as to cover the pixel bank and the organic function layer;
a first inorganic layer disposed on the second electrode;
a second inorganic layer disposed on the first inorganic layer;
an organic buffer layer disposed on the second inorganic layer;
a gas barrier layer disposed on the organic buffer layer; and
a second substrate opposed to the gas barrier layer and disposed above the first substrate,
the first inorganic layer comprising a material having an elastic modulus which is lower than an elastic modulus of the second inorganic layer, a thickness of the first inorganic layer being larger than a thickness of the second inorganic layer and smaller than a thickness of the organic buffer layer, wherein the gas barrier is in direct contact with the organic buffer layer.

18. The emissive device of claim 1, wherein a surface of the organic buffer layer and a surface of the second inorganic layer define a contact angle that is 45° or less.

19. The process of producing the emissive device of claim 11, wherein a surface of the organic buffer layer and a surface of the second inorganic layer define a contact angle that is 45° or less.

20. The emissive device of claim 17, wherein a surface of the organic buffer layer and a surface of the second inorganic layer define a contact angle that is 45° or less.

21. The emissive device of claim 1, wherein the first inorganic layer is composed of silicon dioxide.

22. An emissive device comprising:
a first substrate;
a first electrode;
a pixel bank having an opening that corresponds to the position of the first electrode;
an organic function layer disposed in the opening;
a second electrode disposed so as to cover the pixel bank and the organic function layer;
a first inorganic layer disposed on the second electrode;
a second inorganic layer disposed on the first inorganic layer;
an organic buffer layer disposed on the second inorganic layer;
a gas barrier layer disposed on the organic buffer layer; and
a second substrate opposed to the gas barrier layer and disposed above the first substrate,
the first inorganic layer including a material having an elastic modulus that is lower than an elastic modulus of the second inorganic layer,
wherein the first inorganic layer is composed of silicon dioxide.

23. A process for producing an emissive device, comprising:
forming a first electrode on a first substrate;
forming a pixel bank having an opening corresponding to the position of the first electrode;
forming an organic function layer in the opening;
forming a second electrode in such a manner that the second electrode covers the pixel bank and the organic function layer;
forming a first inorganic layer on the second electrode;
forming a second inorganic layer on the first inorganic layer;
forming an organic buffer layer on the second inorganic layer;
forming a gas barrier layer on the organic buffer layer; and
forming a second substrate opposed to the gas barrier layer and disposed above the substrate, the first inorganic layer including a material having an elastic modulus that is lower than an elastic modulus of the second inorganic layer, wherein the first inorganic layer is composed of silicon dioxide.

24. An emissive device comprising:

a first substrate;

a first electrode a pixel bank having an opening that corresponds to a position of the first electrode;

an organic function layer disposed in the opening;

a second electrode disposed so as to cover the pixel bank and the organic function layer;

a first inorganic layer disposed on the second electrode;

a second inorganic layer disposed on the first inorganic layer;

an organic buffer layer disposed on the second inorganic layer;

a gas barrier layer disposed on the organic buffer layer; and a second substrate opposed to the gas barrier layer and disposed above the first substrate, the first inorganic layer comprising a material having an elastic modulus which is lower than an elastic modulus of the second inorganic layer, a thickness of the first inorganic layer being larger than a thickness of the second inorganic layer and smaller than a thickness of the organic buffer layer, wherein the first inorganic layer is composed of silicon dioxide.

* * * * *